(12) United States Patent
Katkar et al.

(10) Patent No.: US 12,381,119 B2
(45) Date of Patent: Aug. 5, 2025

(54) SEAL FOR MICROELECTRONIC ASSEMBLY

(71) Applicant: ADEIA SEMICONDUCTOR BONDING TECHNOLOGIES INC., San Jose, CA (US)

(72) Inventors: Rajesh Katkar, San Jose, CA (US); Liang Wang, Milpitas, CA (US); Cyprian Emeka Uzoh, San Jose, CA (US); Shaowu Huang, Sunnyvale, CA (US); Guilian Gao, San Jose, CA (US); Ilyas Mohammed, Santa Clara, CA (US)

(73) Assignee: Adeia Semiconductor Bonding Technologies Inc., San Jose, CA (US)

( * ) Notice: Subject to any disclaimer, the term of this patent is extended or adjusted under 35 U.S.C. 154(b) by 0 days.

(21) Appl. No.: 18/463,080

(22) Filed: Sep. 7, 2023

(65) Prior Publication Data

US 2023/0420313 A1    Dec. 28, 2023

Related U.S. Application Data

(60) Continuation of application No. 17/806,253, filed on Jun. 9, 2022, now Pat. No. 12,322,667, which is a
(Continued)

(51) Int. Cl.
*H01L 23/04* (2006.01)
*B81B 7/00* (2006.01)
(Continued)

(52) U.S. Cl.
CPC ............ *H01L 23/10* (2013.01); *B81B 7/0032* (2013.01); *B81B 7/0074* (2013.01);
(Continued)

(58) Field of Classification Search
CPC ....... H01L 23/02; H01L 23/04; H01L 23/053; H01L 23/10; B81B 7/0074; B81C 1/00269; B81C 2203/038
See application file for complete search history.

(56) References Cited

U.S. PATENT DOCUMENTS

| 4,998,665 A | 3/1991 | Hayashi |
|---|---|---|
| 5,087,585 A | 2/1992 | Hayashi |
| (Continued) | | |

FOREIGN PATENT DOCUMENTS

| CN | 101554988 | 10/2009 |
|---|---|---|
| CN | 104779243 A | 7/2015 |
| (Continued) | | |

OTHER PUBLICATIONS

Amirfeiz et al., "Formation of silicon structures by plasma-activated wafer bonding," Journal of The Electrochemical Society, 2000, vol. 147, No. 7, pp. 2693-2698.
(Continued)

*Primary Examiner* — Eduardo A Rodela
(74) *Attorney, Agent, or Firm* — Knobbe, Martens, Olson & Bear, LLP

(57) ABSTRACT

Representative implementations of techniques and devices provide seals for sealing the joints of bonded microelectronic devices as well as bonded and sealed microelectronic assemblies. Seals are disposed at joined surfaces of stacked dies and wafers to seal the joined surfaces. The seals may be disposed at an exterior periphery of the bonded microelectronic devices or disposed within the periphery using the various techniques.

24 Claims, 13 Drawing Sheets

Related U.S. Application Data continuation of application No. 16/678,058, filed on Nov. 8, 2019, now Pat. No. 11,417,576, which is a division of application No. 15/920,759, filed on Mar. 14, 2018, now Pat. No. 10,508,030.

(60) Provisional application No. 62/474,478, filed on Mar. 21, 2017.

(51) Int. Cl.
  *B81C 1/00* (2006.01)
  *H01L 23/02* (2006.01)
  *H01L 23/053* (2006.01)
  *H01L 23/10* (2006.01)

(52) U.S. Cl.
  CPC ...... *B81C 1/00261* (2013.01); *B81C 1/00269* (2013.01); *B81C 1/00333* (2013.01); *H01L 23/02* (2013.01); *H01L 23/04* (2013.01); *H01L 23/053* (2013.01); *B81C 2203/038* (2013.01)

(56) References Cited

U.S. PATENT DOCUMENTS

| | | |
|---|---|---|
| 5,322,593 A | 6/1994 | Hasegawa et al. |
| 5,753,536 A | 5/1998 | Sugiyama et al. |
| 5,771,555 A | 6/1998 | Eda et al. |
| 5,985,739 A | 11/1999 | Plettner et al. |
| 5,998,808 A | 12/1999 | Matsushita |
| 6,008,126 A | 12/1999 | Leedy |
| 6,080,640 A | 6/2000 | Gardner et al. |
| 6,265,775 B1 | 7/2001 | Seyyedy |
| 6,374,770 B1 | 4/2002 | Lee |
| 6,423,640 B1 | 7/2002 | Lee et al. |
| 6,465,892 B1 | 10/2002 | Suga |
| 6,872,984 B1 | 3/2005 | Leung |
| 6,876,062 B2 | 4/2005 | Lee et al. |
| 6,887,769 B2 | 5/2005 | Kellar et al. |
| 6,908,027 B2 | 6/2005 | Tolchinsky et al. |
| 6,998,712 B2 | 2/2006 | Okada et al. |
| 7,045,453 B2 | 5/2006 | Canaperi et al. |
| 7,057,274 B2 | 6/2006 | Heschel |
| 7,078,811 B2 | 7/2006 | Suga |
| 7,105,980 B2 | 9/2006 | Abbott et al. |
| 7,193,423 B1 | 3/2007 | Dalton et al. |
| 7,354,798 B2 | 4/2008 | Pogge et al. |
| 7,359,591 B2 | 4/2008 | Vandentop et al. |
| 7,388,281 B2 | 6/2008 | Krueger et al. |
| 7,467,897 B2 | 12/2008 | Hauffe et al. |
| 7,622,324 B2 | 11/2009 | Enquist et al. |
| 7,750,488 B2 | 7/2010 | Patti et al. |
| 7,768,133 B2 | 8/2010 | Matsui et al. |
| 7,803,693 B2 | 9/2010 | Trezza |
| 7,972,683 B2 | 7/2011 | Gudeman et al. |
| 8,183,127 B2 | 5/2012 | Patti et al. |
| 8,191,756 B2 | 6/2012 | Coppeta et al. |
| 8,241,961 B2 | 8/2012 | Kim et al. |
| 8,269,671 B2 | 9/2012 | Chen et al. |
| 8,314,007 B2 | 11/2012 | Vaufredaz |
| 8,349,635 B1 | 1/2013 | Gan et al. |
| 8,357,931 B2 | 1/2013 | Schieck et al. |
| 8,377,798 B2 | 2/2013 | Peng et al. |
| 8,395,229 B2 | 3/2013 | Garcia-Blanco et al. |
| 8,411,444 B2 | 4/2013 | Gaynes et al. |
| 8,441,131 B2 | 5/2013 | Ryan |
| 8,476,146 B2 | 7/2013 | Chen et al. |
| 8,476,165 B2 | 7/2013 | Trickett et al. |
| 8,482,132 B2 | 7/2013 | Yang et al. |
| 8,501,537 B2 | 8/2013 | Sadaka et al. |
| 8,524,533 B2 | 9/2013 | Tong et al. |
| 8,530,997 B1 | 9/2013 | Yang et al. |
| 8,546,928 B2 | 10/2013 | Merz et al. |
| 8,575,748 B1 * | 11/2013 | Farino ............... B81C 1/00269 257/710 |
| 8,620,164 B2 | 12/2013 | Heck et al. |
| 8,647,987 B2 | 2/2014 | Yang et al. |
| 8,669,602 B2 | 3/2014 | Hayashi |
| 8,697,493 B2 | 4/2014 | Sadaka |
| 8,716,105 B2 | 5/2014 | Sadaka et al. |
| 8,802,538 B1 | 8/2014 | Liu |
| 8,809,123 B2 | 8/2014 | Liu et al. |
| 8,841,002 B2 | 9/2014 | Tong |
| 8,916,448 B2 | 12/2014 | Cheng et al. |
| 8,988,299 B2 | 3/2015 | Kam et al. |
| 9,093,350 B2 | 7/2015 | Endo et al. |
| 9,119,313 B2 | 8/2015 | Zhang et al. |
| 9,142,517 B2 | 9/2015 | Liu et al. |
| 9,142,532 B2 | 9/2015 | Suga et al. |
| 9,171,756 B2 | 10/2015 | Enquist et al. |
| 9,184,125 B2 | 11/2015 | Enquist et al. |
| 9,224,704 B2 | 12/2015 | Landru |
| 9,230,941 B2 | 1/2016 | Chen et al. |
| 9,257,399 B2 | 2/2016 | Kuang et al. |
| 9,299,736 B2 | 3/2016 | Chen et al. |
| 9,312,229 B2 | 4/2016 | Chen et al. |
| 9,318,471 B2 | 4/2016 | Kabe et al. |
| 9,337,235 B2 | 5/2016 | Chen et al. |
| 9,368,866 B2 | 6/2016 | Yu |
| 9,385,024 B2 | 7/2016 | Tong et al. |
| 9,386,688 B2 | 7/2016 | MacDonald et al. |
| 9,391,143 B2 | 7/2016 | Tong et al. |
| 9,394,161 B2 | 7/2016 | Cheng et al. |
| 9,431,368 B2 | 8/2016 | Enquist et al. |
| 9,437,572 B2 | 9/2016 | Chen et al. |
| 9,443,796 B2 | 9/2016 | Chou et al. |
| 9,461,007 B2 | 10/2016 | Chun et al. |
| 9,496,239 B1 | 11/2016 | Edelstein et al. |
| 9,536,848 B2 | 1/2017 | England et al. |
| 9,559,081 B1 | 1/2017 | Lai et al. |
| 9,601,454 B2 | 3/2017 | Zhao et al. |
| 9,620,464 B2 | 4/2017 | Baks et al. |
| 9,620,481 B2 | 4/2017 | Edelstein et al. |
| 9,656,852 B2 | 5/2017 | Cheng et al. |
| 9,723,716 B2 | 8/2017 | Meinhold |
| 9,728,521 B2 | 8/2017 | Tsai et al. |
| 9,741,620 B2 | 8/2017 | Uzoh et al. |
| 9,768,307 B2 | 9/2017 | Yamazaki et al. |
| 9,799,587 B2 | 10/2017 | Fujii et al. |
| 9,834,435 B1 * | 12/2017 | Liu .................. B81C 1/00269 |
| 9,852,988 B2 | 12/2017 | Enquist et al. |
| 9,881,882 B2 | 1/2018 | Hsu et al. |
| 9,893,004 B2 | 2/2018 | Yazdani |
| 9,899,442 B2 | 2/2018 | Katkar |
| 9,929,050 B2 | 3/2018 | Lin |
| 9,941,241 B2 | 4/2018 | Edelstein et al. |
| 9,941,243 B2 | 4/2018 | Kim et al. |
| 9,953,941 B2 | 4/2018 | Enquist |
| 9,960,142 B2 | 5/2018 | Chen et al. |
| 10,002,844 B1 * | 6/2018 | Wang ............... H01L 23/49838 |
| 10,026,605 B2 | 7/2018 | Doub et al. |
| 10,075,657 B2 | 9/2018 | Fahim et al. |
| 10,204,893 B2 | 2/2019 | Uzoh et al. |
| 10,269,756 B2 | 4/2019 | Uzoh |
| 10,276,619 B2 | 4/2019 | Kao et al. |
| 10,276,909 B2 | 4/2019 | Huang et al. |
| 10,418,277 B2 | 9/2019 | Cheng et al. |
| 10,446,456 B2 | 10/2019 | Shen et al. |
| 10,446,487 B2 | 10/2019 | Huang et al. |
| 10,446,532 B2 | 10/2019 | Uzoh et al. |
| 10,508,030 B2 | 12/2019 | Katkar et al. |
| 10,522,499 B2 | 12/2019 | Enquist et al. |
| 10,546,832 B2 | 1/2020 | Wang et al. |
| 10,615,133 B2 | 4/2020 | Kamgaing et al. |
| 10,658,312 B2 | 5/2020 | Kamgaing et al. |
| 10,707,087 B2 | 7/2020 | Uzoh et al. |
| 10,727,219 B2 | 7/2020 | Uzoh et al. |
| 10,784,191 B2 | 9/2020 | Huang et al. |
| 10,790,262 B2 | 9/2020 | Uzoh et al. |
| 10,840,135 B2 | 11/2020 | Uzoh |
| 10,840,205 B2 | 11/2020 | Fountain, Jr. et al. |
| 10,854,578 B2 | 12/2020 | Morein |
| 10,879,207 B2 | 12/2020 | Wang et al. |
| 10,879,210 B2 | 12/2020 | Enquist et al. |

(56) References Cited

U.S. PATENT DOCUMENTS

| | | |
|---|---|---|
| 10,879,212 B2 | 12/2020 | Uzoh et al. |
| 10,886,177 B2 | 1/2021 | DeLaCruz et al. |
| 10,892,246 B2 | 1/2021 | Uzoh |
| 10,923,408 B2 | 2/2021 | Huang et al. |
| 10,923,413 B2 | 2/2021 | DeLaCruz |
| 10,950,547 B2 | 3/2021 | Mohammed et al. |
| 10,964,664 B2 | 3/2021 | Mandalapu et al. |
| 10,985,133 B2 | 4/2021 | Uzoh |
| 10,991,804 B2 | 4/2021 | DeLaCruz et al. |
| 10,998,292 B2 | 5/2021 | Lee et al. |
| 11,004,757 B2 | 5/2021 | Katkar et al. |
| 11,011,503 B2 | 5/2021 | Wang et al. |
| 11,031,285 B2 | 6/2021 | Katkar et al. |
| 11,056,348 B2 | 7/2021 | Theil |
| 11,088,099 B2 | 8/2021 | Katkar et al. |
| 11,127,738 B2 | 9/2021 | DeLaCruz et al. |
| 11,158,606 B2 | 10/2021 | Gao et al. |
| 11,171,117 B2 | 11/2021 | Gao et al. |
| 11,176,450 B2 | 11/2021 | Teig et al. |
| 11,205,600 B2 | 12/2021 | Shen et al. |
| 11,256,004 B2 | 2/2022 | Haba et al. |
| 11,257,727 B2 | 2/2022 | Katkar et al. |
| 11,264,357 B1 | 3/2022 | DeLaCruz et al. |
| 11,276,676 B2 | 3/2022 | Enquist et al. |
| 11,329,034 B2 | 5/2022 | Tao et al. |
| 11,348,898 B2 | 5/2022 | DeLaCruz et al. |
| 11,355,443 B2 | 6/2022 | Huang et al. |
| 11,380,597 B2 | 7/2022 | Katkar et al. |
| 11,417,576 B2 | 8/2022 | Katkar et al. |
| 11,485,670 B2 | 11/2022 | Ruben et al. |
| 11,600,542 B2 | 3/2023 | Huang et al. |
| 11,670,615 B2 | 6/2023 | Wang et al. |
| 11,948,847 B2 | 4/2024 | Katkar et al. |
| 11,955,393 B2 | 4/2024 | Katkar et al. |
| 12,100,684 B2 | 9/2024 | Wang et al. |
| 12,322,667 B2 | 6/2025 | Katkar et al. |
| 2002/0000328 A1 | 1/2002 | Motomura et al. |
| 2002/0003307 A1 | 1/2002 | Suga |
| 2002/0094608 A1 | 7/2002 | Brooks |
| 2002/0179921 A1 | 12/2002 | Cohn |
| 2003/0098060 A1 | 5/2003 | Yoshimi |
| 2004/0084414 A1 | 5/2004 | Sakai et al. |
| 2004/0259325 A1 | 12/2004 | Gan |
| 2005/0009246 A1 | 1/2005 | Enquist et al. |
| 2005/0082653 A1 | 4/2005 | McWilliams et al. |
| 2005/0263866 A1 | 12/2005 | Wan |
| 2006/0001123 A1 | 1/2006 | Heck et al. |
| 2006/0057945 A1 | 3/2006 | Hsu et al. |
| 2006/0097335 A1 | 5/2006 | Kim et al. |
| 2006/0115323 A1 | 6/2006 | Coppeta et al. |
| 2006/0197215 A1 | 9/2006 | Potter |
| 2006/0208326 A1 | 9/2006 | Nasiri et al. |
| 2007/0029562 A1* | 2/2007 | Koizumi .............. B81B 7/0041 257/98 |
| 2007/0045781 A1 | 3/2007 | Carlson et al. |
| 2007/0045795 A1 | 3/2007 | McBean |
| 2007/0096294 A1 | 5/2007 | Ikeda et al. |
| 2007/0111386 A1 | 5/2007 | Kim et al. |
| 2007/0134891 A1 | 6/2007 | Adetutu et al. |
| 2007/0188054 A1 | 8/2007 | Hasken et al. |
| 2007/0222048 A1 | 9/2007 | Huang |
| 2007/0295456 A1 | 12/2007 | Gudeman et al. |
| 2008/0080832 A1 | 4/2008 | Chen et al. |
| 2008/0124835 A1 | 5/2008 | Chen et al. |
| 2008/0261344 A1 | 10/2008 | Jafri et al. |
| 2008/0283995 A1 | 11/2008 | Bucki et al. |
| 2008/0290490 A1 | 11/2008 | Fujii et al. |
| 2008/0296709 A1 | 12/2008 | Haba et al. |
| 2009/0053855 A1 | 2/2009 | Summers |
| 2009/0186446 A1 | 7/2009 | Kwon et al. |
| 2009/0267165 A1 | 10/2009 | Okudo et al. |
| 2010/0078786 A1 | 4/2010 | Maeda |
| 2010/0096713 A1 | 4/2010 | Jung |
| 2010/0148341 A1 | 6/2010 | Fuji et al. |
| 2010/0181676 A1 | 7/2010 | Montez et al. |
| 2010/0252898 A1 | 10/2010 | Tanaka et al. |
| 2010/0288525 A1 | 11/2010 | Basavanhally et al. |
| 2010/0301432 A1 | 12/2010 | Kittilsland et al. |
| 2010/0314149 A1 | 12/2010 | Gerrish et al. |
| 2011/0031633 A1 | 2/2011 | Hsu et al. |
| 2011/0115092 A1 | 5/2011 | Tago |
| 2011/0147859 A1 | 6/2011 | Tanaka et al. |
| 2011/0156242 A1 | 6/2011 | Sakaguchi et al. |
| 2011/0180921 A1* | 7/2011 | Loiselet .............. H01L 23/3128 257/692 |
| 2011/0290552 A1 | 12/2011 | Palmateer et al. |
| 2012/0061776 A1 | 3/2012 | Cheng et al. |
| 2012/0097733 A1 | 4/2012 | Ebefors et al. |
| 2012/0100657 A1 | 4/2012 | Di Cioccio et al. |
| 2012/0112335 A1 | 5/2012 | Ebefors et al. |
| 2012/0142144 A1 | 6/2012 | Taheri |
| 2012/0212384 A1 | 8/2012 | Kam et al. |
| 2012/0267730 A1 | 10/2012 | Renard et al. |
| 2012/0286380 A1 | 11/2012 | Yazdi et al. |
| 2012/0326248 A1 | 12/2012 | Daneman et al. |
| 2013/0099331 A1 | 4/2013 | Chen et al. |
| 2013/0122702 A1 | 5/2013 | Volant et al. |
| 2013/0187245 A1 | 7/2013 | Chien et al. |
| 2013/0271066 A1 | 10/2013 | Signorelli et al. |
| 2013/0277774 A1 | 10/2013 | Frey et al. |
| 2013/0277777 A1 | 10/2013 | Chang et al. |
| 2013/0293428 A1 | 11/2013 | Souriau et al. |
| 2014/0042593 A1 | 2/2014 | Mauder et al. |
| 2014/0175655 A1 | 6/2014 | Chen et al. |
| 2014/0197534 A1 | 7/2014 | Partosa et al. |
| 2014/0217557 A1 | 8/2014 | Chen et al. |
| 2014/0225206 A1 | 8/2014 | Lin et al. |
| 2014/0225795 A1 | 8/2014 | Yu |
| 2014/0264653 A1 | 9/2014 | Cheng et al. |
| 2014/0361413 A1 | 12/2014 | Chapelon |
| 2015/0001632 A1 | 1/2015 | Liu et al. |
| 2015/0064498 A1 | 3/2015 | Tong |
| 2015/0068666 A1 | 3/2015 | Abe et al. |
| 2015/0091153 A1 | 4/2015 | Liu et al. |
| 2015/0097215 A1 | 4/2015 | Chu et al. |
| 2015/0137345 A1 | 5/2015 | Choi et al. |
| 2015/0298965 A1 | 10/2015 | Tsai et al. |
| 2015/0336790 A1 | 11/2015 | Geen et al. |
| 2015/0336792 A1 | 11/2015 | Huang et al. |
| 2016/0002029 A1 | 1/2016 | Nasiri et al. |
| 2016/0016789 A1 | 1/2016 | Yu et al. |
| 2016/0107881 A1 | 4/2016 | Thompson et al. |
| 2016/0137492 A1 | 5/2016 | Cheng et al. |
| 2016/0146851 A1 | 5/2016 | Kamisuki |
| 2016/0229685 A1 | 8/2016 | Boysel |
| 2016/0240495 A1 | 8/2016 | Lachner et al. |
| 2016/0318757 A1 | 11/2016 | Chou et al. |
| 2016/0343682 A1 | 11/2016 | Kawasaki |
| 2017/0001858 A1 | 1/2017 | Adams et al. |
| 2017/0008757 A1 | 1/2017 | Cheng et al. |
| 2017/0062366 A1 | 3/2017 | Enquist |
| 2017/0081181 A1 | 3/2017 | Zhang et al. |
| 2017/0135240 A1 | 5/2017 | Pahl |
| 2017/0137281 A1 | 5/2017 | Favier et al. |
| 2017/0179029 A1 | 6/2017 | Enquist et al. |
| 2017/0186732 A1 | 6/2017 | Chu et al. |
| 2017/0194271 A1 | 7/2017 | Hsu et al. |
| 2017/0200711 A1 | 7/2017 | Uzoh et al. |
| 2017/0305738 A1 | 10/2017 | Chang et al. |
| 2017/0338214 A1 | 11/2017 | Uzoh et al. |
| 2018/0044175 A1 | 2/2018 | Ogashiwa et al. |
| 2018/0047682 A1 | 2/2018 | Chang et al. |
| 2018/0096931 A1 | 4/2018 | Huang et al. |
| 2018/0174995 A1 | 6/2018 | Wang et al. |
| 2018/0175012 A1 | 6/2018 | Wu et al. |
| 2018/0182639 A1 | 6/2018 | Uzoh et al. |
| 2018/0182666 A1 | 6/2018 | Uzoh et al. |
| 2018/0190580 A1 | 7/2018 | Haba et al. |
| 2018/0190583 A1 | 7/2018 | DeLaCruz et al. |
| 2018/0191047 A1 | 7/2018 | Huang et al. |
| 2018/0219038 A1 | 8/2018 | Gambino et al. |
| 2018/0226375 A1 | 8/2018 | Enquist et al. |
| 2018/0269161 A1 | 9/2018 | Wu et al. |
| 2018/0273377 A1 | 9/2018 | Katkar et al. |

(56) References Cited

U.S. PATENT DOCUMENTS

| | | |
|---|---|---|
| 2018/0286805 A1 | 10/2018 | Huang et al. |
| 2018/0323177 A1 | 11/2018 | Yu et al. |
| 2018/0323227 A1 | 11/2018 | Zhang et al. |
| 2018/0331066 A1 | 11/2018 | Uzoh et al. |
| 2018/0337157 A1 | 11/2018 | Wang et al. |
| 2019/0051628 A1 | 2/2019 | Liu et al. |
| 2019/0057924 A1 | 2/2019 | Kim et al. |
| 2019/0096741 A1 | 3/2019 | Uzoh et al. |
| 2019/0096842 A1 | 3/2019 | Fountain, Jr. et al. |
| 2019/0115277 A1 | 4/2019 | Yu et al. |
| 2019/0131277 A1 | 5/2019 | Yang et al. |
| 2019/0164914 A1 | 5/2019 | Hu et al. |
| 2019/0198407 A1 | 6/2019 | Huang et al. |
| 2019/0265411 A1 | 8/2019 | Huang et al. |
| 2019/0333550 A1 | 10/2019 | Fisch |
| 2019/0348336 A1 | 11/2019 | Katkar et al. |
| 2019/0363079 A1 | 11/2019 | Thei et al. |
| 2019/0385935 A1 | 12/2019 | Gao et al. |
| 2019/0385966 A1 | 12/2019 | Gao et al. |
| 2020/0013637 A1 | 1/2020 | Haba |
| 2020/0013765 A1 | 1/2020 | Fountain, Jr. et al. |
| 2020/0035641 A1 | 1/2020 | Fountain, Jr. et al. |
| 2020/0043817 A1 | 2/2020 | Shen et al. |
| 2020/0075520 A1 | 3/2020 | Gao et al. |
| 2020/0075534 A1 | 3/2020 | Gao et al. |
| 2020/0075553 A1 | 3/2020 | DeLaCruz et al. |
| 2020/0118973 A1 | 4/2020 | Wang et al. |
| 2020/0126906 A1 | 4/2020 | Uzoh et al. |
| 2020/0131028 A1 | 4/2020 | Cheng et al. |
| 2020/0140267 A1 | 5/2020 | Katkar et al. |
| 2020/0140268 A1 | 5/2020 | Katkar et al. |
| 2020/0144217 A1 | 5/2020 | Enquist et al. |
| 2020/0194396 A1 | 6/2020 | Uzoh |
| 2020/0227367 A1 | 7/2020 | Haba et al. |
| 2020/0243380 A1 | 7/2020 | Uzoh et al. |
| 2020/0279821 A1 | 9/2020 | Haba et al. |
| 2020/0294908 A1 | 9/2020 | Haba et al. |
| 2020/0328162 A1 | 10/2020 | Haba et al. |
| 2020/0328164 A1 | 10/2020 | DeLaCruz et al. |
| 2020/0328165 A1 | 10/2020 | DeLaCruz et al. |
| 2020/0335408 A1 | 10/2020 | Gao et al. |
| 2020/0371154 A1 | 11/2020 | DeLaCruz et al. |
| 2020/0395321 A1 | 12/2020 | Katkar et al. |
| 2020/0411483 A1 | 12/2020 | Uzoh et al. |
| 2021/0028534 A1 | 1/2021 | Liu et al. |
| 2021/0098412 A1 | 4/2021 | Haba et al. |
| 2021/0118864 A1 | 4/2021 | DeLaCruz et al. |
| 2021/0134689 A1 | 5/2021 | Huang et al. |
| 2021/0143125 A1 | 5/2021 | DeLaCruz et al. |
| 2021/0181510 A1 | 6/2021 | Katkar et al. |
| 2021/0193603 A1 | 6/2021 | Katkar et al. |
| 2021/0193624 A1 | 6/2021 | DeLaCruz et al. |
| 2021/0193625 A1 | 6/2021 | DeLaCruz et al. |
| 2021/0202428 A1 | 7/2021 | Wang et al. |
| 2021/0242152 A1 | 8/2021 | Fountain, Jr. et al. |
| 2021/0265227 A1 | 8/2021 | Katkar et al. |
| 2021/0296282 A1 | 9/2021 | Gao et al. |
| 2021/0305202 A1 | 9/2021 | Uzoh et al. |
| 2021/0366820 A1 | 11/2021 | Uzoh |
| 2021/0407941 A1 | 12/2021 | Haba |
| 2022/0077063 A1 | 3/2022 | Haba |
| 2022/0077087 A1 | 3/2022 | Haba |
| 2022/0139867 A1 | 5/2022 | Uzoh |
| 2022/0139869 A1 | 5/2022 | Gao et al. |
| 2022/0208650 A1 | 6/2022 | Gao et al. |
| 2022/0208702 A1 | 6/2022 | Uzoh |
| 2022/0208723 A1 | 6/2022 | Katkar et al. |
| 2022/0246497 A1 | 8/2022 | Fountain, Jr. et al. |
| 2022/0285303 A1 | 9/2022 | Mirkarimi et al. |
| 2022/0319901 A1 | 10/2022 | Suwito et al. |
| 2022/0320035 A1 | 10/2022 | Uzoh et al. |
| 2022/0320036 A1 | 10/2022 | Gao et al. |
| 2022/0367302 A1 | 11/2022 | Katkar et al. |
| 2022/0415734 A1 | 12/2022 | Katkar et al. |
| 2023/0005850 A1 | 1/2023 | Fountain, Jr. |
| 2023/0019869 A1 | 1/2023 | Mirkarimi et al. |
| 2023/0036441 A1 | 2/2023 | Haba et al. |
| 2023/0067677 A1 | 3/2023 | Lee et al. |
| 2023/0069183 A1 | 3/2023 | Haba |
| 2023/0100032 A1 | 3/2023 | Haba et al. |
| 2023/0115122 A1 | 4/2023 | Uzoh et al. |
| 2023/0122531 A1 | 4/2023 | Uzoh |
| 2023/0123423 A1 | 4/2023 | Gao et al. |
| 2023/0125395 A1 | 4/2023 | Gao et al. |
| 2023/0130259 A1 | 4/2023 | Haba et al. |
| 2023/0132632 A1 | 5/2023 | Katkar et al. |
| 2023/0140107 A1 | 5/2023 | Uzoh et al. |
| 2023/0142680 A1 | 5/2023 | Guevara et al. |
| 2023/0154816 A1 | 5/2023 | Haba et al. |
| 2023/0154828 A1 | 5/2023 | Haba et al. |
| 2023/0187264 A1 | 6/2023 | Uzoh et al. |
| 2023/0187317 A1 | 6/2023 | Uzoh |
| 2023/0187412 A1 | 6/2023 | Gao et al. |
| 2023/0197453 A1 | 6/2023 | Fountain, Jr. et al. |
| 2023/0197496 A1 | 6/2023 | Theil |
| 2023/0197559 A1 | 6/2023 | Haba et al. |
| 2023/0197560 A1 | 6/2023 | Katkar et al. |
| 2023/0197655 A1 | 6/2023 | Theil et al. |
| 2023/0207402 A1 | 6/2023 | Fountain, Jr. et al. |
| 2023/0207437 A1 | 6/2023 | Haba |
| 2023/0207474 A1 | 6/2023 | Uzoh et al. |
| 2023/0207514 A1 | 6/2023 | Gao et al. |
| 2023/0215836 A1 | 7/2023 | Haba et al. |
| 2023/0245950 A1 | 8/2023 | Haba et al. |
| 2023/0260858 A1 | 8/2023 | Huang et al. |
| 2023/0268300 A1 | 8/2023 | Uzoh et al. |
| 2023/0299029 A1 | 9/2023 | Theil et al. |
| 2023/0343734 A1 | 10/2023 | Uzoh et al. |
| 2023/0360950 A1 | 11/2023 | Gao |
| 2023/0361074 A1 | 11/2023 | Uzoh et al. |
| 2023/0369136 A1 | 11/2023 | Uzoh et al. |
| 2023/0375613 A1 | 11/2023 | Haba et al. |
| 2024/0038702 A1 | 2/2024 | Uzoh |
| 2024/0055407 A1 | 2/2024 | Workman et al. |
| 2024/0079376 A1 | 3/2024 | Suwito et al. |
| 2024/0105674 A1 | 3/2024 | Uzoh et al. |
| 2024/0120245 A1 | 4/2024 | Katkar et al. |
| 2024/0162102 A1 | 5/2024 | Katkar et al. |
| 2024/0170411 A1 | 5/2024 | Chang et al. |
| 2024/0186248 A1 | 6/2024 | Haba et al. |
| 2024/0186268 A1 | 6/2024 | Uzoh et al. |
| 2024/0186269 A1 | 6/2024 | Haba |
| 2024/0203917 A1 | 6/2024 | Katkar et al. |
| 2024/0213191 A1 | 6/2024 | Theil et al. |
| 2024/0213210 A1 | 6/2024 | Haba et al. |
| 2024/0217210 A1 | 7/2024 | Zhao et al. |
| 2024/0222239 A1 | 7/2024 | Gao et al. |
| 2024/0222315 A1 | 7/2024 | Uzoh |
| 2024/0222319 A1 | 7/2024 | Gao et al. |
| 2024/0249985 A1 | 7/2024 | Katkar et al. |
| 2024/0266255 A1 | 8/2024 | Haba et al. |
| 2024/0298454 A1 | 9/2024 | Haba |
| 2024/0304593 A1 | 9/2024 | Uzoh |
| 2024/0312951 A1 | 9/2024 | Theil et al. |
| 2024/0332184 A1 | 10/2024 | Katkar et al. |
| 2024/0332227 A1 | 10/2024 | Uzoh et al. |
| 2024/0332231 A1 | 10/2024 | Uzoh |
| 2024/0332267 A1 | 10/2024 | Haba et al. |
| 2024/0387419 A1 | 11/2024 | Mrozek et al. |
| 2025/0004197 A1 | 1/2025 | Haba et al. |
| 2025/0006632 A1 | 1/2025 | Chang et al. |
| 2025/0006642 A1 | 1/2025 | Haba et al. |
| 2025/0006674 A1 | 1/2025 | Uzoh et al. |
| 2025/0006679 A1 | 1/2025 | Theil et al. |
| 2025/0006689 A1 | 1/2025 | Uzoh et al. |
| 2025/0054854 A1 | 2/2025 | Katkar et al. |
| 2025/0079364 A1 | 3/2025 | Uzoh et al. |
| 2025/0079385 A1 | 3/2025 | Wang et al. |
| 2025/0096191 A1 | 3/2025 | Gao et al. |

(56) References Cited

U.S. PATENT DOCUMENTS

| | | | |
|---|---|---|---|
| 2025/0112123 | A1 | 4/2025 | Katkar et al. |
| 2025/0185163 | A1 | 6/2025 | Zhao et al. |

FOREIGN PATENT DOCUMENTS

| | | | |
|---|---|---|---|
| CN | 109390305 | A | 2/2019 |
| EP | 2813465 | A1 | 12/2014 |
| JP | H10-112517 | | 4/1998 |
| JP | 2000-100679 | | 4/2000 |
| JP | 2001-102479 | | 4/2001 |
| JP | 2001-148436 | | 5/2001 |
| JP | 2002-353416 | | 12/2002 |
| JP | 2008-130915 | | 6/2008 |
| JP | 2009-014469 | A | 1/2009 |
| JP | 2009-039843 | | 2/2009 |
| JP | 2009-238905 | | 10/2009 |
| JP | 2010-199608 | | 9/2010 |
| JP | 2011-054637 | A | 3/2011 |
| JP | 2011-131309 | | 7/2011 |
| JP | 2012204443 | A | 10/2012 |
| JP | 2013-33786 | | 2/2013 |
| JP | 2013-513227 | | 4/2013 |
| JP | 2013-243333 | | 12/2013 |
| JP | 2014-219321 | | 11/2014 |
| JP | 2015-100886 | | 6/2015 |
| JP | 2015-153791 | | 8/2015 |
| JP | 2016-099224 | | 5/2016 |
| JP | 2018-160519 | | 10/2018 |
| KR | 10-2005-0101324 | | 10/2005 |
| KR | 10-2015-0097798 | | 8/2015 |
| KR | 10-2017-0108143 | | 9/2017 |
| TW | 201210098 | A1 | 3/2012 |
| TW | 201423876 | A | 6/2014 |
| TW | 201517175 | A | 5/2015 |
| TW | I533399 | B | 5/2016 |
| WO | WO 2005/043584 | A2 | 5/2005 |
| WO | WO 2006/100444 | A1 | 9/2006 |
| WO | WO 2007/103224 | A2 | 9/2007 |
| WO | WO 2012/130730 | A1 | 10/2012 |
| WO | WO 2014-074403 | A1 | 5/2014 |
| WO | WO 2017/100256 | A1 | 6/2017 |
| WO | WO 2017/151442 | A1 | 9/2017 |

OTHER PUBLICATIONS

Beer et al., "Coplanar 122GHz Antenna Array With Air Cavity Reflector for Integration in Plastic Packages", IEEE Antennas and Wireless Propagation Letters, 11:160-163, Jan. 2012.
Bush, Steve, "Electronica: Automotive power modules from On Semi," ElectronicsWeekly.com, indicating an ONSEMI AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).
Chung et al., "Room temperature GaAseu + Si and InPeu + Si wafer direct bonding by the surface activate bonding method," Nuclear Instruments and Methods in Physics Research Section B: Beam Interactions with Materials and Atoms, Jan. 2, 1997, vol. 121, Issues 1-4, pp. 203-206.
Chung et al., "Wafer direct bonding of compound semiconductors and silicon at room temperature by the surface activated bonding method," Applied Surface Science, Jun. 2, 1997, vols. 117-118, pp. 808-812.
Daneman, "Applying the CMOS Test Flow to MEMS Manufacturing", InvenSense, Inc., accessed on Apr. 5, 2020.
Farrens et al., "Chemical free room temperature wafer to wafer direct bonding," J. Electrochem. Soc., The Electrochemical Society, Inc., Nov. 1995, vol. 142, No. 11. pp. 3949-3955.
Farrens et al., "Chemical free wafer bonding of silicon to glass and sapphire," Electrochemical Society Proceedings vol. 95-7, 1995, pp. 72-77.
Gösele et al., "Semiconductor Wafer Bonding: A flexible approach to materials combinations in microelectronics; micromechanics and optoelectronics," IEEE, 1997, pp. 23-32.
Gu et al., "A Multilayer Organic Package with 64 Dual-Polarized Antennas for 28GHz 5G Communication", IBM Research, pp. 1-3, 2017.
Hosoda et al., "Effect of the surface treatment on the room-temperature bonding of Al to Si and SiO2," Journal of Materials Science, Jan. 1, 1998, vol. 33, Issue 1, pp. 253-258.
Hosoda et al., "Room temperature GaAs-Si and InP-Si wafer direct bonding by the surface activated bonding method," Nuclear Inst. And Methods in Physics Research B, 1997, vol. 121, Nos. 1-4, pp. 203-206.
Howlader et al., "A novel method for bonding of ionic wafers," Electronics Components and Technology Conference, 2006, IEEE, p. 7-pp.
Howlader et al., "Bonding of p-Si/n-InP wafers through surface activated bonding method at room temperature," Indium Phosphide and Related Materials, 2001, IEEE International Conference On, pp. 272-275.
Howlader et al., "Characterization of the bonding strength and interface current of p-Si/ n-InP wafers bonded by surface activated bonding method at room temperature," Journal of Applied Physics, Mar. 1, 2002, vol. 91, No. 5, pp. 3062-3066.
Howlader et al., "Investigation of the bonding strength and interface current of p-SionGaAs wafers bonded by surface activated bonding at room temperature," J. Vac. Sci. Technol. B 19, Nov./Dec. 2001, pp. 2114-2118.
Inertial MEMS Manufacturing Trends 2014 Report by Yole Developpement Sample Report, Slide 11, https://www.slideshare.net/Yole_Developpement/yole-inertial-memsmanufacturingtrends2014sample.
International Search Report and Written Opinion mailed Apr. 13, 2018 in International Application No. PCT/US2017/067742, 14 pages.
International Search Report and Written Opinion mailed Apr. 16, 2018 in International Application No. PCT/US2017/067741, 17 pages.
International Search Report and Written Opinion mailed May 31, 2018 in International Application No. PCT/US2018/022688, 2 pages.
International Search Report and Written Opinion mailed Mar. 7, 2019, in International Application No. PCT/US2018/060044, 14 pages.
International Search Report and Written Opinion mailed Apr. 22, 2019 in International Application No. PCT/US2018/064982, 13 pages.
International Search Report and Written Opinion mailed Aug. 26, 2019 in International Application No. PCT/US2019/031113, 14 pages.
Itoh et al., "Characteristics of fritting contacts utilized for micromachined wafer probe cards," 2000 American Institute of Physics, AIP Review of Scientific Instruments, vol. 71, 2000, pp. 2224.
Itoh et al., "Characteristics of low force contact process for MEMS probe cards," Sensors and Actuators A: Physical, Apr. 1, 2002, vols. 97-98, pp. 462-467.
Itoh et al., "Development of MEMS IC probe card utilizing fritting contact," Initiatives of Precision Engineering at the Beginning of a Millennium: 10th International Conference on Precision Engineering (ICPE) Jul. 18-20, 2001, Yokohama, Japan, 2002, Book Part 1, pp. 314-318.
Itoh et al., "Room temperature vacuum sealing using surface activated bonding method," The 12th International Conference on Solid State Sensors, Actuators and Microsystems, Boston, Jun. 8-12, 2003, 2003 IEEE, pp. 1828-1831.
Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.
Kim et al., "Low temperature direct Cu-Cu bonding with low energy ion activation method," Electronic Materials and Packaging, 2001, IEEE, pp . 193-195.

(56) References Cited

OTHER PUBLICATIONS

Kim et al., "Room temperature Cu-Cu direct bonding using surface activated bonding method," J. Vac. Sci. Technol., 2003 American Vacuum Society, Mar./Apr. 2003, vol. 21, No. 2, pp. 449-453.

Kim et al., "Wafer-scale activated bonding of Cu-CU, Cu-Si, and Cu-SiO2 at low temperature," Proceedings—Electrochemical Society, 2003, vol. 19, pp. 239-247.

Matsuzawa et al., "Room-temperature interconnection of electroplated Au microbump by means of surface activated bonding method," Electornic Components and Technology Confererence, 2001, 51st Proceedings, IEEE, pp. 384-387.

Moriceau, H. et al., "Overview of recent direct wafer bonding advances and applications," Advances in Natural Sciences-Nanoscience and Nanotechnology, 2010, 11 pages.

Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.

Nakanishi, H. et al., "Studies on SiO2-SiO2 bonding with hydrofluoric acid. Room temperature and low stress bonding technique for MEMS," Sensors and Actuators, 2000, vol. 79, pp. 237-244.

Norton, Francis, "Permeation of gases through solids," Journal of Applied Physics, Jan. 1957, vol. 28, No. 1.

Oberhammer, J. et al., "Sealing of adhesive bonded devices on wafer level," Sensors and Actuators A, 2004, vol. 110, No. 1-3, pp. 407-412, see pp. 407-412, and Figures 1(a)-1(I), 6 pages.

Onodera et al., "The effect of prebonding heat treatment on the separability of Au wire from Ag-plated Cu alloy substrate," Electronics Packaging Manufacturing, IEEE Transactions, Jan. 2002, vol. 25, Issue 1, pp. 5-12.

Plobi, A. et al., "Wafer direct bonding: tailoring adhesion between brittle materials," Materials Science and Engineering Review Journal, 1999, R25, 88 pages.

Reiche et al., "The effect of a plasma pretreatment on the Si/Si bonding behaviouir," Electrochemical Society Proceedings, 1998, vol. 97-36, pp. 437-444.

Roberds et al., "Low temperature, in situ, plasma activated wafer bonding," Electrochecmical Society Proceedings, 1997, vol. 97-36, pp. 598-606.

Shigetou et al., "Room temperature bonding of ultra-fine pitch and low-profiled Cu electrodes for bump-less interconnect," 2003 Electronic Components and Technology Conference, pp. 848-852.

Shigetou et al., "Room-temperature direct bonding of CMP-Cu film for bumpless interconnection," Electronic Components and Technology Confererence, 51st Proceedings, 2001, IEEE, pp. 755-760.

Shingo et al., "Design and fabrication of an electrostatically actuated MEMS probe card," TRANDUCERS, Solid-State Sensors, Actuators and Microsystems, 12th International Conference, Jun. 8-12, 2003, vol. 2, pp. 1522-1525.

Sony IMX260 image, cross section of Sony dual-pixel sensor product labeled IMX260, showing peripheral probe and wire bond pads in a bonded structure. The part in the image was shipped in Apr. 2016. Applicant makes no representation that the part in the image is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260.".

Suga et al., "A new approach to Cu-Cu direct bump bonding," IEMT/IMC Symposium, 1997, Joint International Electronic Manufacturing Symposium and the International Microelectronics Conference, Apr. 16-18, 1997, IEEE, pp. 146-151.

Suga et al., "A new bumping process using lead-free solder paste," Electronics Packaging Manufacturing, IEEE Transactions on (vol. 25, Issue 4), IEEE, Oct. 2002, pp. 253-256.

Suga et al., "A new wafer-bonder of ultra-high precision using surface activated bonding (SAB) concept," Electronic Components and Technology Conference, 2001, IEEE, pp. 1013-1018.

Suga et al., "Bump-less interconnect for next generation system packaging," Electronic Components and Technology Conference, 2001, IEEE, pp. 1003-1008.

Suga, T., "Feasibility of surface activated bonding for ultra-fine pitch interconnection—A new concept of bump-less direct bonding for system level packaging," The University of Tokyo, Research Center for Science and Technology, 2000 Electronic Components and Technology Conference, 2000 IEEE, pp. 702-705.

Suga, T., "Room-temperature bonding on metals and ceramics," Proceedings of the Second International Symposium on Semiconductor Wafer Bonding: Science, Technology and Applications, The Electrochemical Society Proceedings, vol. 93-29 (1993), pp. 71-80.

Suga et al., "Surface activated bonding—an approach to joining at room temperature," Ceramic Transactions: Structural Ceramics Joining II, The American Ceramic Society, 1993, pp. 323-331.

Suga et al., "Surface activated bonding for new flip chip and bumpless interconnect systems," Electronic Components and Technology Conference, 2002, IEEE, pp. 105-111.

Suga, "UHV room temperature joining by the surface activated bonding method," Advances in science and technology, Techna, Faenza, Italie, 1999, pp. C1079-C1089.

Taiwan Office Action mailed Apr. 20, 2021, Taiwan Application No. 107109294, 5 pages.

Takagi et al., "Effect of surface roughness on room-temperature wafer bonding by Ar beam surface activation," Japanese Journal of Applied Physics, 1998, vol. 37, Part 1, No. 1, pp. 4197.

Takagi et al., "Low temperature direct bonding of silicon and silicon dioxide by the surface activation method," Solid State Sensors and Actuators, 1997, Transducers '97 Chicago, 1997 International Conference, vol. 1, pp. 657-660.

Takagi et al., "Room-temperature bonding of lithium niobate and silicon wafers by argon-beam surface activation," Appl. Phys. Lett., 1999. vol. 74, pp. 2387.

Takagi et al., "Room temperature silicon wafer direct bonding in vacuum by Ar beam irradiation," Micro Electro Mehcanical Systems, MEMS '97 Proceedings, 1997, IEEE, pp. 191-196.

Takagi et al., "Room-temperature wafer bonding of Si to LiNbO3, LiTaO3 and Gd3Ga5O12 by Ar-beam surface activation," Journal of Micromechanics and Microengineering, 2001, vol. 11, No. 4, pp. 348.

Takagi et al., "Room-temperature wafer bonding of silicon and lithium niobate by means of arbon-beam surface activation," Integrated Ferroelectrics: An International Journal, 2002, vol. 50, Issue 1, pp. 53-59.

Takagi et al., "Surface activated bonding silicon wafers at room temperature," Appl. Phys. Lett. 68, 2222 (1996).

Takagi et al., "Wafer-scale room-temperature bonding between silicon and ceramic wafers by means of argon-beam surface activation," Micro Electro Mechanical Systems, 2001, MEMS 2001, The 14th IEEE International Conference, Jan. 25, 2001, IEEE, pp. 60-63.

Takagi et al., "Wafer-scale spontaneous bonding of silicon wafers by argon-beam surface activation at room temperature," Sensors and Actuators A: Physical, Jun. 15, 2003, vol. 105, Issue 1, pp. 98-102.

Tong et al., "Low temperature wafer direct bonding," Journal of Microelectomechanical systems, Mar. 1994, vol. 3, No. 1, pp. 29-35.

Topol et al., "Enabling technologies for wafer-level bonding of 3D MEMS and integrated circuit structures," 2004 Electronics Components and Technology Conference, 2004 IEEE, pp. 931-938.

Wang et al., "Reliability and microstructure of Au-Al and Au-Cu direct bonding fabricated by the Surface Activated Bonding," Electronic Components and Technology Conference, 2002, IEEE, pp. 915-919.

Wang et al., "Reliability of Au bump—Cu direct interconnections fabricated by means of surface activated bonding method," Microelectronics Reliability, May 2003, vol. 43, Issue 5, pp. 751-756.

Weldon et al., "Physics and chemistry of silicon wafer bonding investigated by infrared absorption spectroscopy," Journal of Vacuum Science & Technology B, Jul./Aug. 1996, vol. 14, No. 4, pp. 3095-3106.

(56) References Cited

OTHER PUBLICATIONS

Xu et al., "New Au-Al interconnect technology and its reliability by surface activated bonding," Electronic Packaging Technology Proceedings, Oct. 28-30, 2003, Shanghai, China, pp. 479-483.
Zhang et al., "Antenna-on-Chip and Antenna-in-Package Solutions to Highly Integrated Millimeter-Wave Devices for Wireless Communications", IEEE Transactions on Antennas and Propagation, 57(10):2830-2841, Oct. 2009.
Zhou et al., "A Wideband Circularly Polarized Patch Antenna for 60 GHz Wireless Communications", Wireless Engineering and Technology, 3:97-105, 2012.
Zoschke, K. et al., "Hermetic wafer level packaging of MEMS components using through silicon via and wafer to wafer bonding technologies," 2013 Electronic Components & Technology Conference, 2013 IEEE, pp. 1500-1507.
"The Advantages of Integrated MEMS to Enable the Internet of Moving Things", mCube, White Paper Jan. 2018.
Ceramic Microstructures: Control at the Atomic Level, Recent Progress in Surface Activated Bonding, 1998, pp. 385-389.
Android Wiki, "Samsung Galaxy S2," indicating that the Samsung Galaxy S2 was unveiled on Feb. 13, 2011, at the Mobile World Congress (MWC) in Barcelona, https://android.fandom.com/wiki/Samsung_Galaxy_S2 (downloaded Nov. 20, 2023).
Gadgets360, "Sony Xperia S," indicating that the Sony Xperia LT26i product was released on Feb. 12, 2012, https://www.gadgets360.com/sony-xperia-s-609 (downloaded Nov. 20, 2023).
Michailos, Jean, "Future landscape for 3D Integration: from Interposers to 3D High Density," 3d ASIP—Dec. 13-15, 2016, San Francisco Airport, USA, 46 pages.
Onsemi AR0820 image, cross section of a CMOS image sensor product. The part in the image was shipped on Sep. 16, 2021. Applicant makes no representation that the part in the image is identical to the part identified in the separately submitted reference BUSH, Nov. 8, 2018, ElectronicsWeekly.com ("BUSH article"); however, the imaged part and the part shown in the BUSH article share the part number "ONSEMI AR0820.".
OmniVision Technologies, Inc., "OmniVision Announces New Family of 20-Megapixel PureCel® Plus-S Sensors for High-End Smartphones," PR Newswire, https://www.prnewswire.com/news-releases/omnivision-announces-new-family-of-20-megapixel-purecelplus-s-sensors-for-high-end-smartphones-300358733.html (dated Nov. 7, 2016; downloaded Nov. 20, 2023).
Samsung S5K3H2YX03 image, cross section of a back side illuminated CMOS image sensor (CIS) product, taken from Samsung Galaxy S2 phone. The part in the image was shipped on Nov. 25, 2011. The cross section shows tungsten and aluminum lining a trench formed in the back side of the sensor connecting a wire bond with a contact in the image sensor. The second image is a top-down view showing the wire bond pad and the trench that are depicted in the cross section. Applicant makes no representation that the part in the images is identical to image sensor products in the Galaxy S2 product identified in the separately submitted Android Wiki reference https://android.fandom.com/wiki/Samsung_Galaxy_S2 ("Android Wiki article"); however, the imaged sensor was obtained from a product named "Galaxy S2.".
Sony Xperia LT26i Sensor image, cross-section of a front side illuminated CMOS image sensor obtained from a Sony Xperia LT26i phone. The part in the image was received on Mar. 29, 2012. The cross section shows a metal line connecting a solder bump at the back side to a contact at the front side of the sensor, with non-conductive epoxy covering the metal. The second image is a bottom-up view of the image sensor. The third image is a bottom-up closeup view showing the edge of the sensor, with the solder bumps and metal line of the cross-section visible. Applicant makes no representation that the part in the images is identical to image sensor products in the Sony Xperia LT26i product identified in the separately submitted Gadgets360 reference https://www.gadgets360.com/sony-xperia-s-609 ("Gadgets360 article"); however, the imaged sensor was obtained from a product named "Sony Xperia LT26i.".

\* cited by examiner

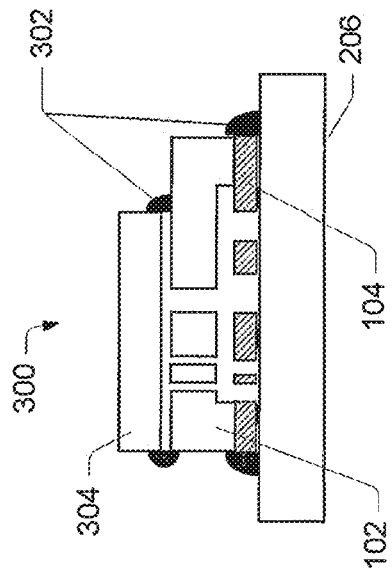
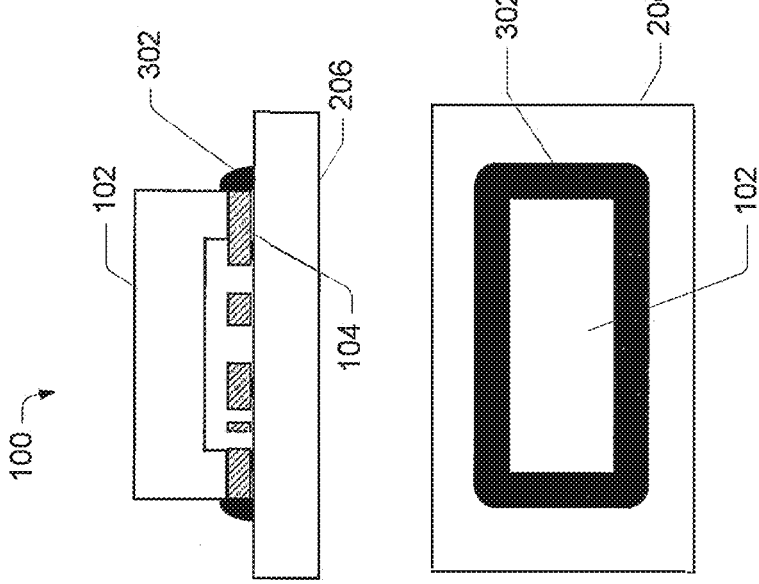
FIG. 3A
FIG. 3B
FIG. 3C

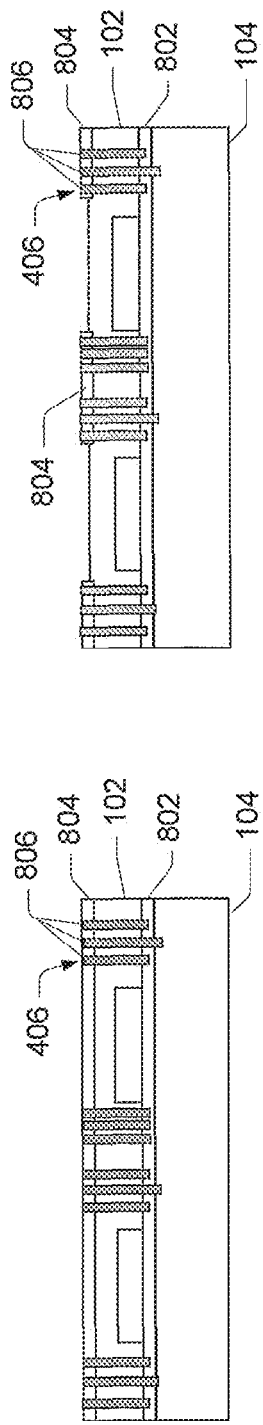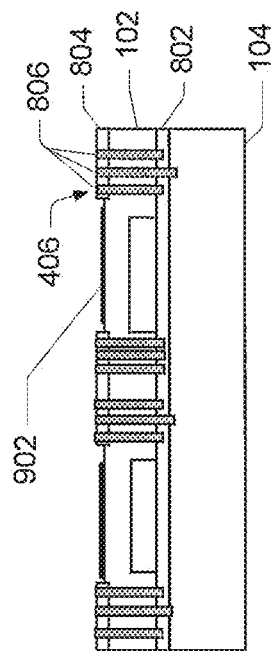

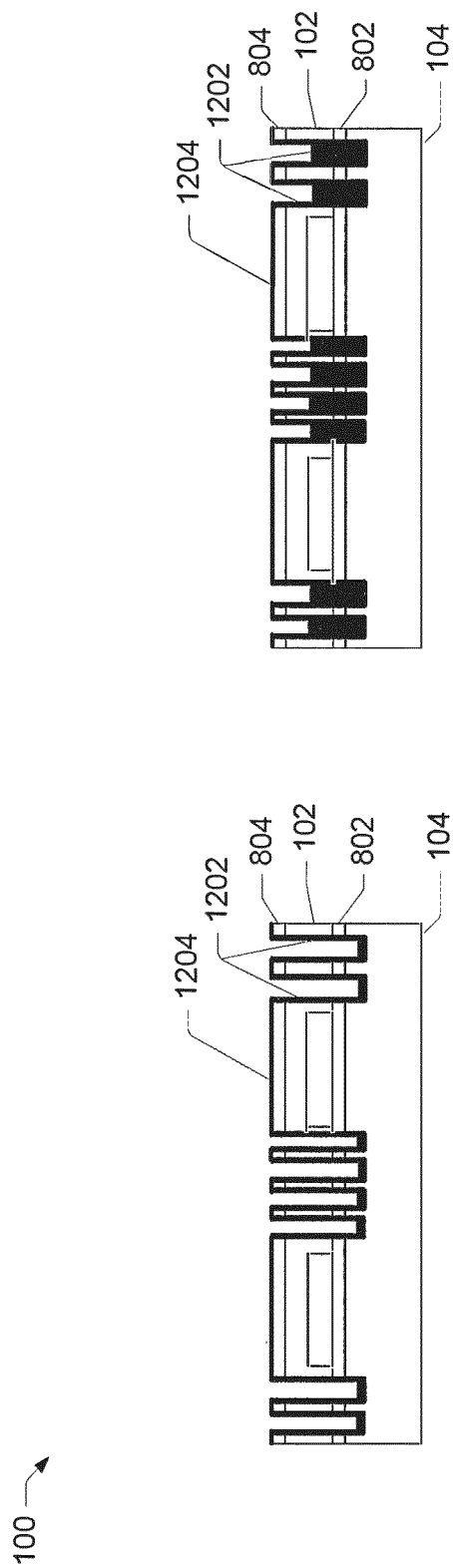
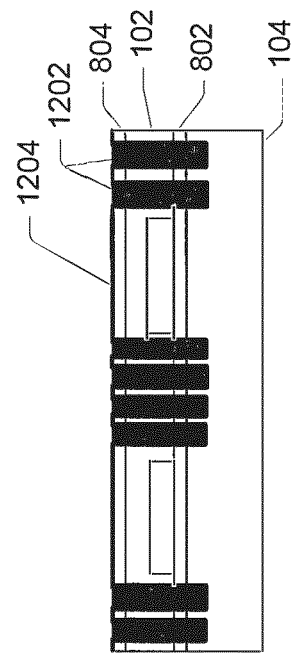
FIG. 13A
FIG. 13B
FIG. 13C

SEAL FOR MICROELECTRONIC ASSEMBLY

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

FIELD

The following description relates to processing of integrated circuits ("ICs"). More particularly, the following description relates to devices and techniques for processing IC dies and assemblies.

BACKGROUND

The demand for more compact physical arrangements of microelectronic elements such as integrated chips and dies has become even more intense with the rapid progress of portable electronic devices, the expansion of the Internet of Things, nano-scale integration, subwavelength optical integration, and more. Merely by way of example, devices commonly referred to as "smart phones" integrate the functions of a cellular telephone with powerful data processors, memory and ancillary devices such as global positioning system receivers, electronic cameras, a variety of sensors, and local area network connections along with high-resolution displays and associated image processing chips. Such devices can provide capabilities such as full internet connectivity, entertainment including full-resolution video, navigation, electronic banking and more, all in a pocket-size device. Complex portable devices require packing numerous chips and dies into a small space.

Microelectronic elements often comprise a thin slab of a semiconductor material, such as silicon or gallium arsenide. Chips and dies are commonly provided as individual, prepackaged units. In some unit designs, the die is mounted to a substrate or a chip carrier, which is in turn mounted on a circuit panel, such as a printed circuit board (PCB). Dies can be provided in packages that facilitate handling of the die during manufacture and during mounting of the die on the external substrate. For example, many dies are provided in packages suitable for surface mounting.

Numerous packages of this general type have been proposed for various applications. Most commonly, such packages include a dielectric element, commonly referred to as a "chip carrier" with terminals formed as plated or etched metallic structures on the dielectric. The terminals typically are connected to the contacts (e.g., bond pads) of the die by conductive features such as thin traces extending along the die carrier and by fine leads or wires extending between the contacts of the die and the terminals or traces. In a surface mounting operation, the package may be placed onto a circuit board so that each terminal on the package is aligned with a corresponding contact pad on the circuit board. Solder or other bonding material is generally provided between the terminals and the contact pads. The package can be permanently bonded in place by heating the assembly so as to melt or "reflow" the solder or otherwise activate the bonding material.

Many packages include solder masses in the form of solder balls that are typically between about 0.02 mm and about 0.8 mm (5 and 30 mils) in diameter, and are attached to the terminals of the package. A package having an array of solder balls projecting from its bottom surface (e.g., surface opposite the front face of the die) is commonly referred to as a ball grid array or "BGA" package. Other packages, referred to as land grid array or "LGA" packages are secured to the substrate by thin layers or lands formed from solder. Packages of this type can be quite compact. Certain packages, commonly referred to as "chip scale packages," occupy an area of the circuit board equal to, or only slightly larger than, the area of the device incorporated in the package. This scale is advantageous in that it reduces the overall size of the assembly and permits the use of short interconnections between various devices on the substrate, which in turn limits signal propagation time between devices and thus facilitates operation of the assembly at high speeds.

Semiconductor dies can also be provided in "stacked" arrangements, wherein one die is provided on a carrier, for example, and another die is mounted on top of the first die. These arrangements can allow a number of different dies to be mounted within a single footprint on a circuit board and can further facilitate high-speed operation by providing a short interconnection between the dies. Often, this interconnect distance can be only slightly longer than the thickness of the die itself. For interconnection to be achieved within a stack of die packages, interconnection structures for mechanical and electrical connection may be provided on both sides (e.g., surfaces) of each die package (except, perhaps, for the topmost package). This has been done, for example, by providing contact pads or lands on both sides of the substrate to which the die is mounted, the pads being connected through the substrate by conductive vias or the like. Examples of stacked chip arrangements and interconnect structures are provided in U.S. Patent App. Pub. No. 2010/0232129, the disclosure of which is incorporated by reference herein. In other examples, Through Silicon Vias (TSVs) are used for interconnection to be achieved within a stack of die packages. In some cases, dies or wafers may be bonded in a stacked arrangement using various bonding techniques, including direct dielectric bonding, non-adhesive techniques, such as ZiBond® or a hybrid bonding technique, such as DBI®, both available from Invensas Bonding Technologies, Inc. (formerly Ziptronix, Inc.), an Xperi company (see for example, U.S. Pat. Nos. 6,864,585 and 7,485,968, which are incorporated herein in their entirety).

Stacked die and wafer arrangements, including bonded arrangements, may also be used to form assembled components such as microelectromechanical systems (MEMS), sensors, and the like. See, for example, U.S. Pat. No. 7,109,092, which is incorporated herein in its entirety. In many of these arrangements, it is desirable for the stacked dies and wafers to be sealed at their joined surfaces, for instance, to form a sensor cavity. In some cases, making such seals reliable and long-lasting can be problematic, particularly at the chip scale.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternately, other implementations of devices and/or systems may include additional components, or various combinations of the described components, and remain within the scope of the disclosure.

FIG. 3A shows a plan view of an example sealed microelectronic device, according to an embodiment. FIG. 3B shows a top view of the example sealed microelectronic device, according to the embodiment. FIG. 3C shows a sealed multi-stack microelectronic arrangement.

FIGS. 9A-9C illustrate example embodiments of sealed microelectronic devices, according to various embodiments.

FIGS. 13A-13C illustrate example embodiments of sealed microelectronic devices, according to various embodiments.

DETAILED DESCRIPTION

Overview

Figure 1:
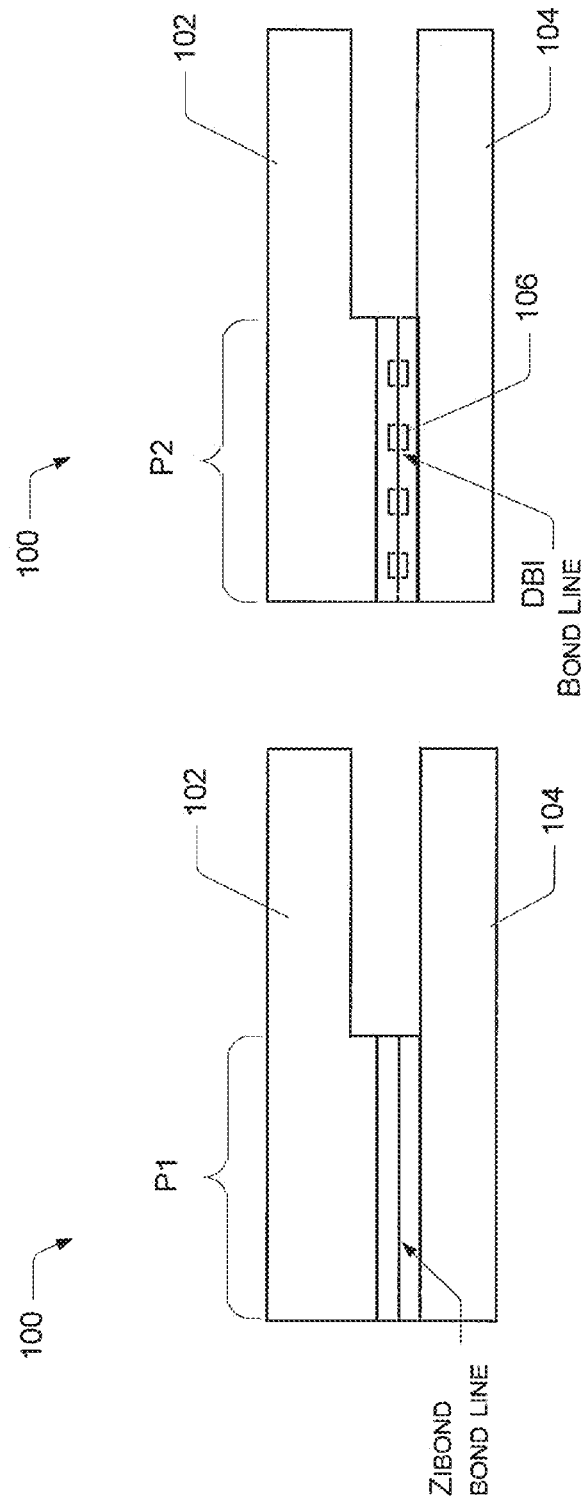
FIG. 1A shows a cavity wafer bonded to a MEMS wafer using a Zibond technique.
FIG. 1B shows a cavity wafer bonded to a MEMS wafer using a Zibond technique with a DBI technique.

Various embodiments of techniques and devices for forming seals and sealed microelectronic devices are disclosed. Seals are disposed at joined (e.g., bonded, coupled, etc.) surfaces of stacked dies and wafers to seal (e.g., hermetically seal) the joined surfaces. The joined surfaces may be sealed to form sensor cavities, or the like, as part of the microelectronic devices. For instance, when a die with a recessed surface is bonded to another die with a flat surface or a recessed surface, a cavity can be formed between the two dies. In some applications, it may be desirable for this cavity to be hermetically sealed, to maintain a specific vacuum level inside the cavity and for predetermined leak rates to be maintained.

The leak rate of a sealed cavity can be looked at as a function of the cavity's volume. For example, if the volume of a cavity is less than or equal to 0.01 cc, generally, the leak rate is to be below 5E-8 atm-cc/s of air to consider the cavity hermetically sealed. If the volume of the cavity ranges between 0.01 and 0.4 cc, the leak rate is to be below 1E-7, and if the volume is greater than 0.4 cc, then the leak rate is to be below 1E-6 for a hermetically sealed cavity (per MIL-STD-883 Method 1014, MIL-STD-750 Method 1071).

The integrity of a seal at the periphery of a stack of dies can be critical to maintain the application specific hermeticity and low leak rates of the package. Metals, ceramics, and glasses are the typical materials used to form the seal and to prevent water vapor or other gases (e.g. oxygen, etc.) from accessing components inside the package. A properly made hermetic seal with a sufficiently low leak rate can keep the interior of a package dry and moisture free for many years.

The techniques disclosed herein include forming seals of one or more metallic materials (for example) at a joint (e.g., a bond line, a seam, etc.) of at least two surfaces, which seals the joined surfaces at the joint. In various implementations, metallic materials may be deposited using electroless plating, or the like. In some embodiments, metallic materials may be deposited directly onto the joined surfaces at or around the joint. In other embodiments, one or more non-metallic materials may be deposited onto the joined surfaces, and metallic material can be deposited over the non-metallic material(s), sealing the joint. The seal may include a continuous sealing ring formed completely around joined dies or wafers (e.g., a periphery of the devices) or one or more partial seals, as desired.

In various embodiments, the techniques disclosed can seal dies and wafers that are stacked and bonded using "ZIBOND®" techniques, which can benefit from the added seal. For example, at FIG. 1A, a cavity wafer 102 is bonded to a microelectromechanical system (MEMS) wafer 104 (or any other wafer) using a ZIBOND® technique, for example, to form a microelectronic device 100 such as a MEMS sensor device. A cavity wafer 102 (or a die) may have 1 or more cavities or recesses of the same or varying size. Especially-flat surfaces of the two wafers (102 and 104) are bonded together using a low temperature covalent bond between the two corresponding semiconductor and/or insulator layers. While the bond may be good, the seal may not be adequate as a hermetic seal, and the leak rates may not be as low as desired for the application. Further, the bond line width (P1) may not be optimal, since a relatively long bond line can unnecessarily increase the die size and can reduce the number of dies fabricated per wafer.

In another example, as shown at FIG. 1B, the seal may be improved by forming one or more metal-to-metal interconnections along the bonding seam using a Direct Bond Interconnect (DBI®) technique. Metallic lines 106 are deposited along each of the surfaces to be joined, so as to be aligned to each other, and form metal-to-metal bonds when set together using temperature and/or pressure. In some cases, the DBI lines 106 can help to reduce the bond line width (P2) while improving the hermeticity of the joint. However, the bond line width (P1) needed for utilizing a ZiBond method may not be adequate for the application (e.g., a 100 micron bond line width using Zibond may be reduced to tens of microns or less than 10 microns, using DBI for example). Further, such DBI bonds are not easy to achieve, potentially adding to the complexity and cost of the assembly.

Figure 2:
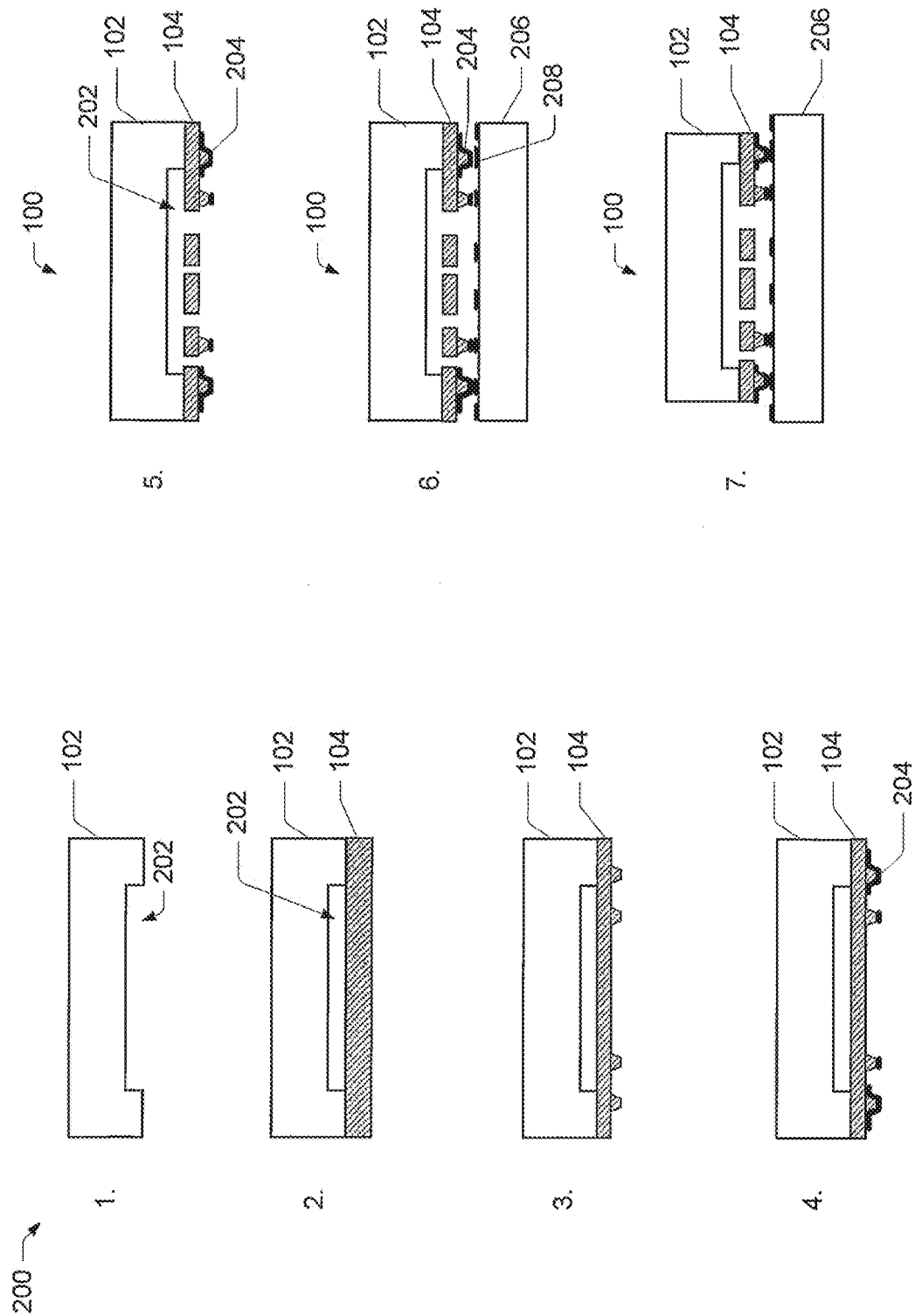
FIG. 2 is a graphical flow diagram illustrating an example processing sequence to form a stacked microelectronic device.

FIG. 2 is a graphical flow diagram illustrating an example processing sequence 200 to form a stacked microelectronic device 100. The process 200 and the stacked microelectronic device 100 form a background for discussing various sealing techniques and devices. In various embodiments, the process 200 described with reference to FIG. 2 may be modified to include the techniques and devices for hermetically sealing bonded components at the bond joints. FIG. 2 describes the process for a 3 die stack creating a hermetically sealed cavity 202 between top (and middle) and (middle and) bottom die. But a stack could also include only 2 dies with a cavity 202 between them, as depicted in FIG. 1.

At block 1, a recessed cavity wafer 102 is formed. Although one cavity 202 is shown in the illustration at block 1, one or more cavities 202 of similar or different dimensions may be formed per die location, effectively forming several such recessed cavities 202 on a wafer (or die) 102. At block 2, the cavity wafer 102 is bonded to a MEMS wafer 104 (or any other wafer or die) closing the cavity 202 within. The cavity wafer 102 can be bonded to the MEMS wafer 104 using an intimate surface bonding technique, for example, a ZIBOND® technique, wherein insulating surfaces (e.g., SiOx—SiOx, etc.) are bonded. At block 3, the MEMS wafer 104 may be thinned and patterned to form stand-offs. At block 4, metallization 204 can be added to the patterned surface of the MEMS wafer 104, including pads, contacts, traces, and so forth. In an alternate example, no metallization 204 is added to the surface of the MEMS wafer 104. In the example, the microelectronic device 100 can be attached to another device, such as a logic device wafer, for example, using a Zibond technique (e.g., SiOx—SiOx bond) or the like at the bonded surfaces, or using other bonding techniques for dielectrics (such as a polymeric material, e.g. die attached film or paste) on one or both bonded surfaces.

At block 5, openings are formed in the MEMS wafer 104, accessing the cavity 202, to define the characteristics of the microelectronic device 100, based on the application. At block 6, the microelectronic device 100 can be attached to a logic device wafer (or die) 206, to provide logic/control (for example) for the microelectronic device 100. Metallization layer 204 contact pads of the microelectronic device 100 are coupled to contacts 208 on the surface of the logic device 206. At block 7, portions of the microelectronic device 100 (such as portions of the cavity wafer 102) are removed (e.g., etched, etc.) to provide access to other contact pads of the logic device wafer 206, and so forth. In some instances, the Zibond or DBI interface between the cavity wafer 102 and the MEMS wafer 104 may provide an adequate resistance to the flow of fluids, such as gases and/or liquids. In other embodiments, one or more of the bond lines or coupling joints of the microelectronic device 100 can be sealed for hermeticity (e.g., a predetermined resistance to the flow of fluids, such as gases and/or liquids, and sufficiently low moisture vapor transmission rate, oxygen transmission rate, etc.), as discussed below.

Example Embodiments

To ensure a strong and hermetically sealed bond, the techniques disclosed herein include bonding insulator surfaces of the wafers (e.g., 102 and 104), then adding a metallic seal at the bond line to improve the hermeticity, as discussed further below.

FIG. 3 shows example embodiments of sealing a microelectronic device 100, such as the microelectronic device 100 formed with reference to FIG. 2. As shown by the side view of the microelectronic device 100 at FIG. 3A and the top view at FIG. 3B, a metallic seal ring 302 can be formed surrounding the bonded joint of the cavity wafer 102 and the MEMS wafer 104, and can also be extended to seal the logic device 206 to the MEMS wafer 104. The seal ring 302 creates a hermetic seal around a periphery of the microelectronic components (e.g., 102, 104, and 206), fully sealing the joints between the components. The seal ring 302 can be located to seal any or all of the joints between the microelectronic components (e.g., 102, 104, and 206), as desired.

In various embodiments, the seal ring 302 is comprised of a metallic material (i.e., a metal such as copper, for example, an alloy, or a metallic composition). In some embodiments, two or more metallic materials may be used in layers (or other combinations) to form the seal ring 302. In the various embodiments, the seal ring 302 is deposited using electro-less plating, electro-deposition, mechanical printing, or various combinations thereof, or the like.

As shown at FIG. 3C, multiple seal rings 302 may be used to seal between multiple components (e.g., 102, 104, 206, and 304) at different stacking levels in a stacked microelectronic arrangement 300. Seal rings 302 may be used at any or all of the levels of the stacked arrangement 300, as desired. While complete seal rings 302 are discussed and illustrated, partial seal rings 302 may also be used where desired to form seals at bond joints or between components (e.g., 102, 104, 206, and 304) of a microelectronic device (e.g., 100, 300) or assembly.

Figure 4:
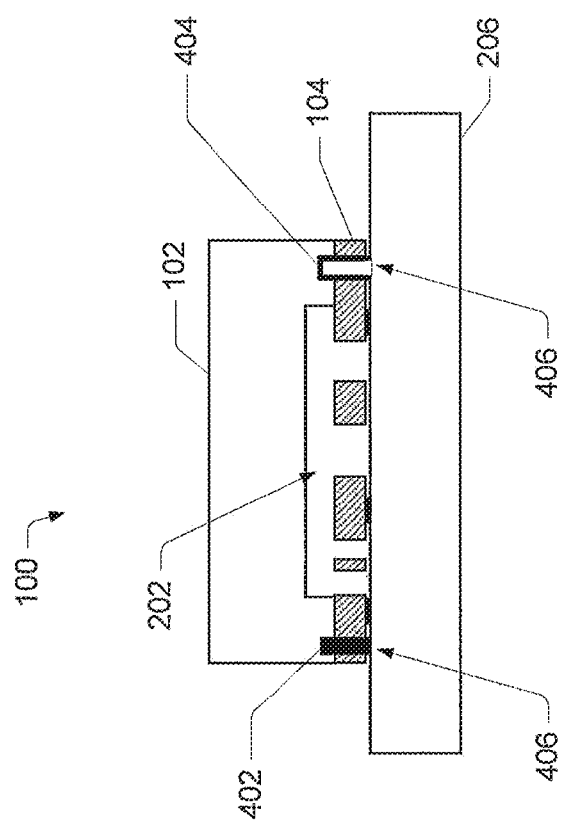
FIG. 4 shows an example sealed microelectronic device, according to another embodiment. Two separate configurations of example seals are illustrated in the example.

FIG. 4 shows an example sealed microelectronic device 100, according to another embodiment, using interior seals (e.g., 402 and 404). Alternately or in addition to the exterior seal rings 302 shown in FIG. 3, interior seals (e.g., 402 and 404) are formed after drilling, etching, or otherwise forming a channel 406 (fully or partially) around an inside perimeter of the bonded components (e.g., 102, 104, and 206). Two separate configurations of example seals are illustrated in FIG. 4, a filled seal 402 and a conformal seal 404. Both configurations are formed in channels 406, drilled portions, or the like, as discussed further below. The filled seal ring 402 mostly or fully fills the channel 406 or drilled cavity with one or more metallic materials to form the hermetic seal at the bond joint. The conformal seal ring 404 plates the walls of the channel 406 or cavity with the one or more metallic materials to form the hermetic seal. In various implementations, either the filled seal 404 or the conformal seal 406 may be used to hermetically seal two or more components (e.g., 102, 104, and 206), as desired. In various examples, multiple concentric seal rings (e.g., 302, 402, and 404) may be used to seal two (or more) components (e.g., 102, 104, and 206). The channel(s) 406 may extend through component 104 and to the interface with component 102 or, as shown, into component 102.

Figure 5:
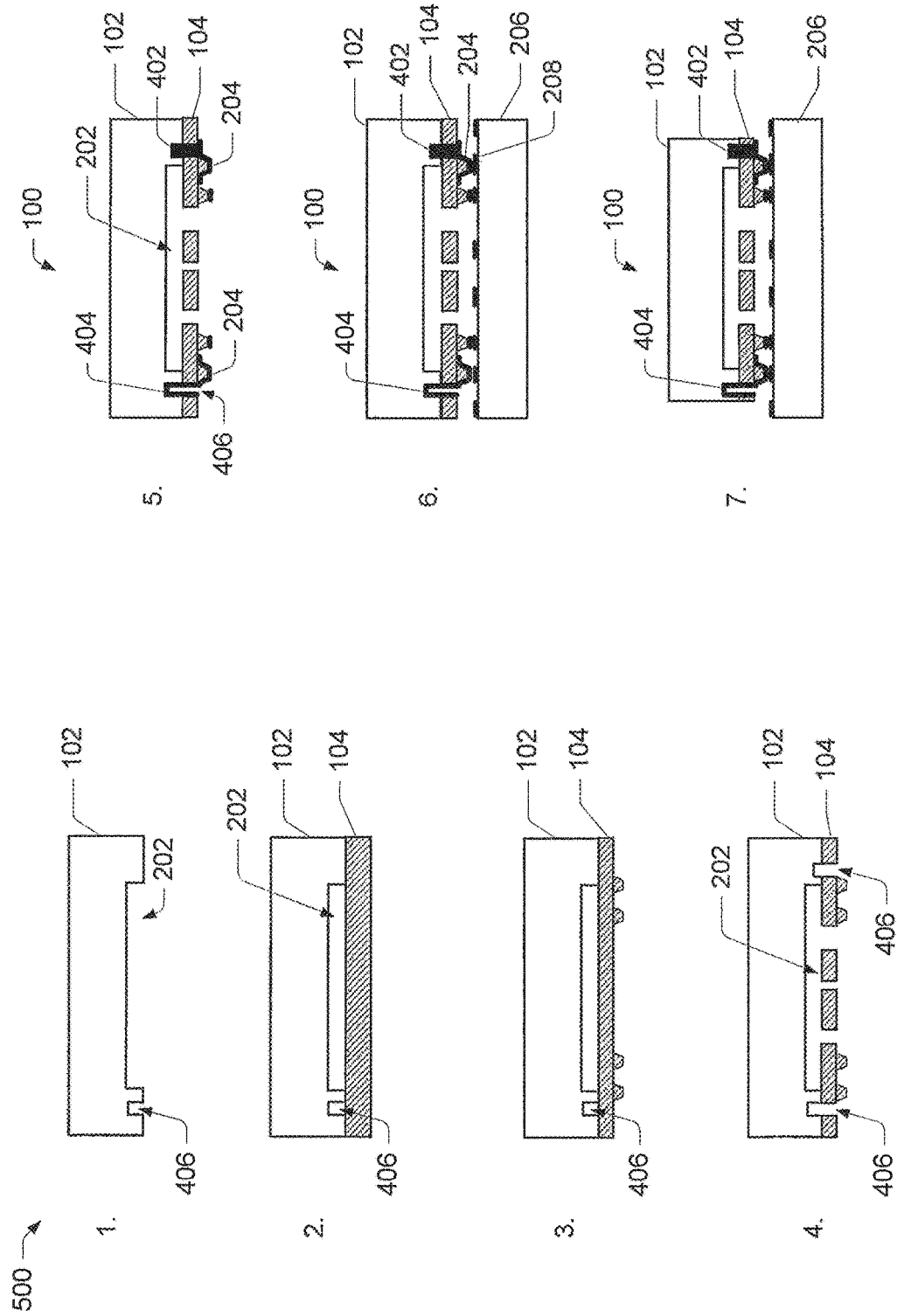
FIG. 5 is a graphical flow diagram illustrating an example processing sequence to form a sealed microelectronic device, according to an embodiment.

FIG. 5 is a graphical flow diagram illustrating an example processing sequence 500 to form a sealed microelectronic device 100, according to an embodiment using interior seals (e.g., 402 and 404). In various embodiments, the process 500 described with reference to FIG. 5 may be used to modify other assembly processes (e.g., the process 200 referred to at FIG. 2, for example) that include bonding microelectronic components (e.g., 102, 104, 206, etc.), to include techniques and devices for hermetically sealing the bonded microelectronic components (e.g., 102, 104, 206, etc.) at the bond joints, as desired.

At block 1, a recessed cavity wafer 102 is formed. A channel 406 (or "cavity ring," partly or fully surrounding the cavity 202) is formed on the cavity-side surface of the wafer 102. The channel 406 may be formed by etching, drilling, or otherwise removing material from the surface of the wafer 102.

At block 2, the cavity wafer 102 is bonded to a MEMS wafer 104 closing the cavity 202 within. The cavity wafer 102 can be bonded to the MEMS wafer 104 using an intimate surface bonding technique, for example, such as a ZIBOND® technique, wherein insulating surfaces (e.g., SiOx—SiOx, etc.) are bonded. In another example, the cavity wafer 102 can be bonded to the MEMS wafer 104 using another dielectric bonding technique (e.g. die attach film or paste, a polymeric material such as a silicone or epoxy, or the like, which may not provide a hermetic seal and may not improve or fix a hermetic seal).

At block 3, the MEMS wafer 104 may be thinned and patterned to form stand-offs. In another case, the stand-offs are optional and may not be formed on the MEMS wafer 104. In such a case, the standoffs can be formed on the logic wafer 206 or can be created by any other material (e.g. die attach film or paste, etc.). At block 4, openings are formed in the MEMS wafer 104, accessing the cavity 202, to define the characteristics of the microelectronic device 100, based on the application. Also, channels 406 are formed in the MEMS wafer 104 (and in the cavity wafer 102, in some examples) for forming interior seals (e.g., 402 and 404) to seal the bonding joint between the cavity wafer 102 and the MEMS wafer 104. In one case the MEMS wafer 104 can be drilled to open an area in the MEMS wafer 104 that is aligned with the cavity ring channel 406 previously formed in the cavity wafer 102. In an alternate case, the MEMS wafer 104 and the cavity wafer 102 can be drilled together to form the cavity ring channel 406 (e.g., the channel 406 in the cavity wafer 102 is formed at this step, while drilling the MEMS wafer 104, rather than being pre-formed prior to bonding the cavity wafer 102 to the MEMS wafer 104).

At block 5, metallization 204 is added to the patterned surface of the MEMS wafer 104, including pads, contacts, traces, and so forth. The cavity ring channel 406 can also be metallized at this time. The channel 406 can be partially or fully filled/plated to form a filled seal ring 402, or the walls of the channel 406 can be metallized/plated to form a conformal seal ring 404. Either the filled seal ring 402 or the conformal seal ring 404 (whichever is used) hermetically seal the bond joint between the cavity wafer 102 and the MEMS wafer 104.

In another example, after bonding, the MEMS wafer 104 and the cavity wafer 102 can be drilled together to form the cavity ring channel 406, which can be metallized and then the openings to the cavity 202 are formed in the MEMS wafer 104.

At block 6, the microelectronic device 100 may be attached to a logic device 206, to provide logic/control (for example) for the microelectronic device 100. Contact pads of the metallized layer 204 of the microelectronic device 100 can be coupled to contacts 208 on the surface of the logic device 206. At block 7, portions of the microelectronic device 100 may be removed (e.g., etched, etc.) to provide access to other contact pads of the logic device 206, and so forth.

Figure 6A:
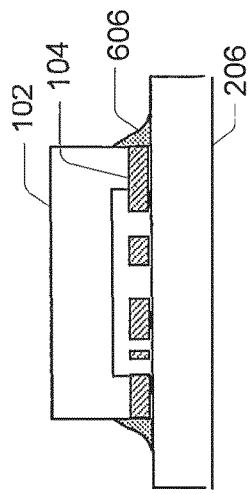
FIGS. 6A-6E illustrate example embodiments of seals and sealed microelectronic devices, according to various embodiments.

FIGS. 6A-6E illustrate example embodiments of seals 302, 402, and 404 and sealed microelectronic devices 100, according to various embodiments. A first embodiment, illustrated at FIG. 6A, shows exterior seals 302 implemented as discussed above with reference to FIGS. 3 and 4. Each seal 302 forms a bead that covers one or more bonding or coupling joints between the microelectronic components 102, 104, and 206, to hermetically seal the joints. The seals 302 can be comprised of a metallic material such as a metal, an alloy, or a metal composite, for example a combination of two or more metals, a metal-glass composite material, a metal-ceramic composite, or the like.

Figure 6B:
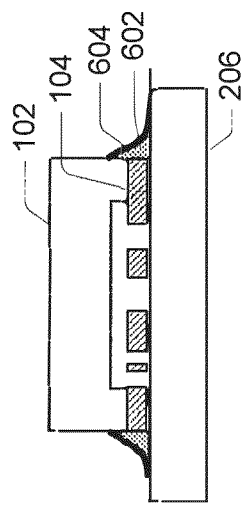

A second embodiment, illustrated at FIG. 6B, shows seals having a layered approach, where a polymer seal 602 is applied to the exterior of the joint first and a metallic material seal 604 is deposited over the polymer seal 602, forming a hermetic seal. In alternate implementations, multiple polymer materials forming one or more polymer seals 602 and/or multiple metallic layers forming one or more metallic seals 604 may also be used to form a seal ring.

Figure 6C:
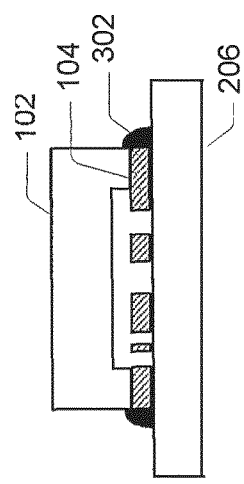

A third embodiment, illustrated at FIG. 6C, shows another exterior seal ring 606, comprised of a sinterable conductive paste, a fritted glass composite, or the like. The metallic or glass components in the deposited seal 606 material provide the hermetic seal desired.

Figure 6D:
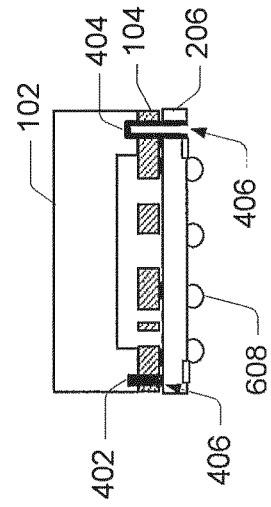

A fourth embodiment, illustrated at FIG. 6D, shows interior seals 402 and 404 as discussed above with reference to FIGS. 5 and 6. A channel 406 is formed through the MEMS wafer 104 and into the cavity wafer 102, and the channel 406 is plated from the MEMS wafer 104 side with metallic material, either fully (e.g., 402), partially (not shown) or conformal (e.g., 404) to the channel 406 walls.

Figure 6E:
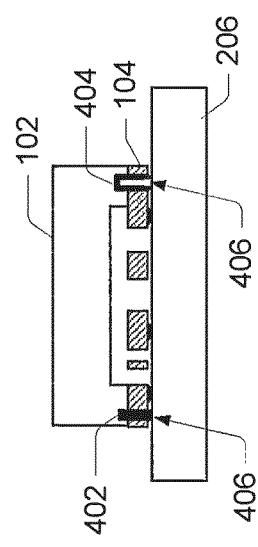

A fifth embodiment, illustrated at FIG. 6E, shows an example of forming a seal ring (e.g., 404) through multiple components (e.g., 102, 104, and 206). In this example, the logic wafer 206 (or the like) can be thinned and drilled through, similar to the MEMS wafer 104. For example, the logic wafer 206, MEMS wafer 104, and cavity wafer 102 may be bonded in a process and then drilled together, or in separate steps to be aligned. Plating or filling the drilled channel 406 from the logic wafer 206 side forms a seal ring (e.g., 404) that extends from the logic wafer 206, through the MEMS wafer 104, and into the cavity wafer 102, hermetically sealing each of the bonding joints and the spaces between the components (e.g., 102, 104, and 206). Alternately, the seal (e.g., 404) may extend through only some of the layers/components as desired. In various embodiments, the metallization of the seals (e.g., 402, 404) may be electrically continuous with or coupled to one or more device pads, for grounding, or the like (which may also be electrically continuous with a ball terminal 608 (for example) on the package. While multiple types of metallization (conformal, nonconformal) are shown in FIGS. 6D, 6E and elsewhere in this disclosure, only a single type of metallization may be used at a time to form a continuous or discontinuous shape for inhibiting fluid flow and, thus, improving hermeticity.

FIGS. 7A-7D illustrate example embodiments of seals 402 and 404 and sealed microelectronic devices 100, according to further embodiments. In one embodiment, illustrated at FIG. 7A, an embedded metallic ring 702 is partially or fully embedded within the cavity wafer 102 (and/or the MEMS wafer 104) and partially or fully surrounds the cavity 202. The embedded metallic ring 702, which may be disposed at or near the bond line, can aid in sealing the bond joint between the cavity wafer 102 and the MEMS wafer 104. A via (not shown for the sake of simplicity) may extend through cavity wafer 102 and contact the metallic ring 702. In another embodiment, illustrated at FIG. 7B, the microelectronic device 100 includes an embedded metallic ring 702 partially or fully surrounding the cavity 202, as well as one or more interior seals 402 and/or 404, as discussed above with reference to FIGS. 5 and 6. A channel 406 is formed through the MEMS wafer 104 and into the cavity wafer 102, to the embedded metallic ring 702, and the channel 406 is plated from the MEMS wafer 104 side with metallic material, either fully (e.g., 402), partially (not shown) or conformal (e.g., 404) to the channel 406 walls.

Figure 7A:
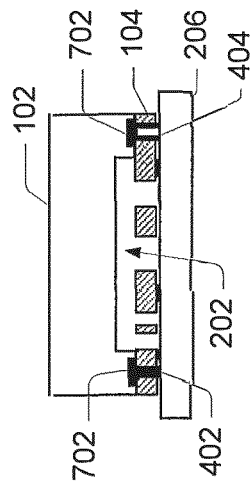
FIGS. 7A-7D illustrate example embodiments of seals and sealed microelectronic devices, according to further embodiments.
Figure 7B:
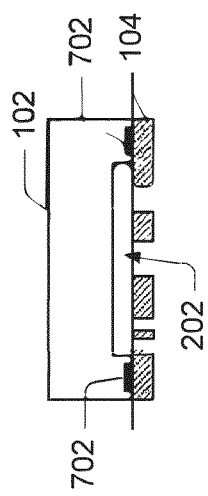
Figure 7C:
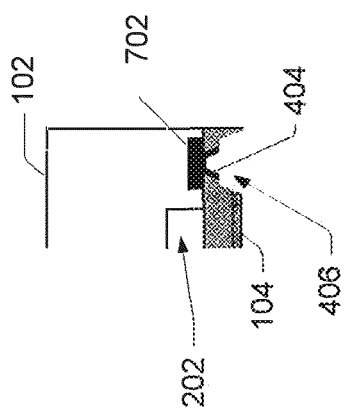
Figure 7D:
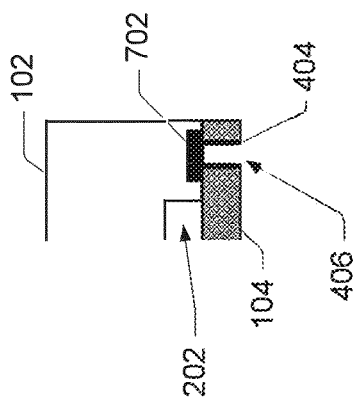

As shown in FIG. 7B, the interior seals 402 and/or 404 are landed on (e.g., are in contact with) the embedded metallic ring 702. FIGS. 7C and 7D show close detail views of two possible embodiments (of many) for this arrangement. For example, in FIG. 7C, the channel 406 has a relatively rectangular cross-section, and in FIG. 7D, the channel has a polygonal, or otherwise shaped cross-section (e.g., partially or fully elliptical, irregular, etc.). In various embodiments, the width of the cross-section of the channel 406 and the seal (402 and/or 404), where the seal (402 and/or 404) makes contact with the embedded metallic ring 702, is less (e.g., 60% or less) than the width of the cross-section of the embedded metallic ring 702. The metallic fill for the seals 404 may be fully (as seen in FIG. 7C) or partially (as seen in FIG. 7D) lining the interior walls of the channel 406, while making contact with (landed on) the embedded metallic ring 702. In various embodiments, the shape of the channel 406 may be predetermined, or may be a product of the drilling techniques employed to form the channel 406.

Figure 8:
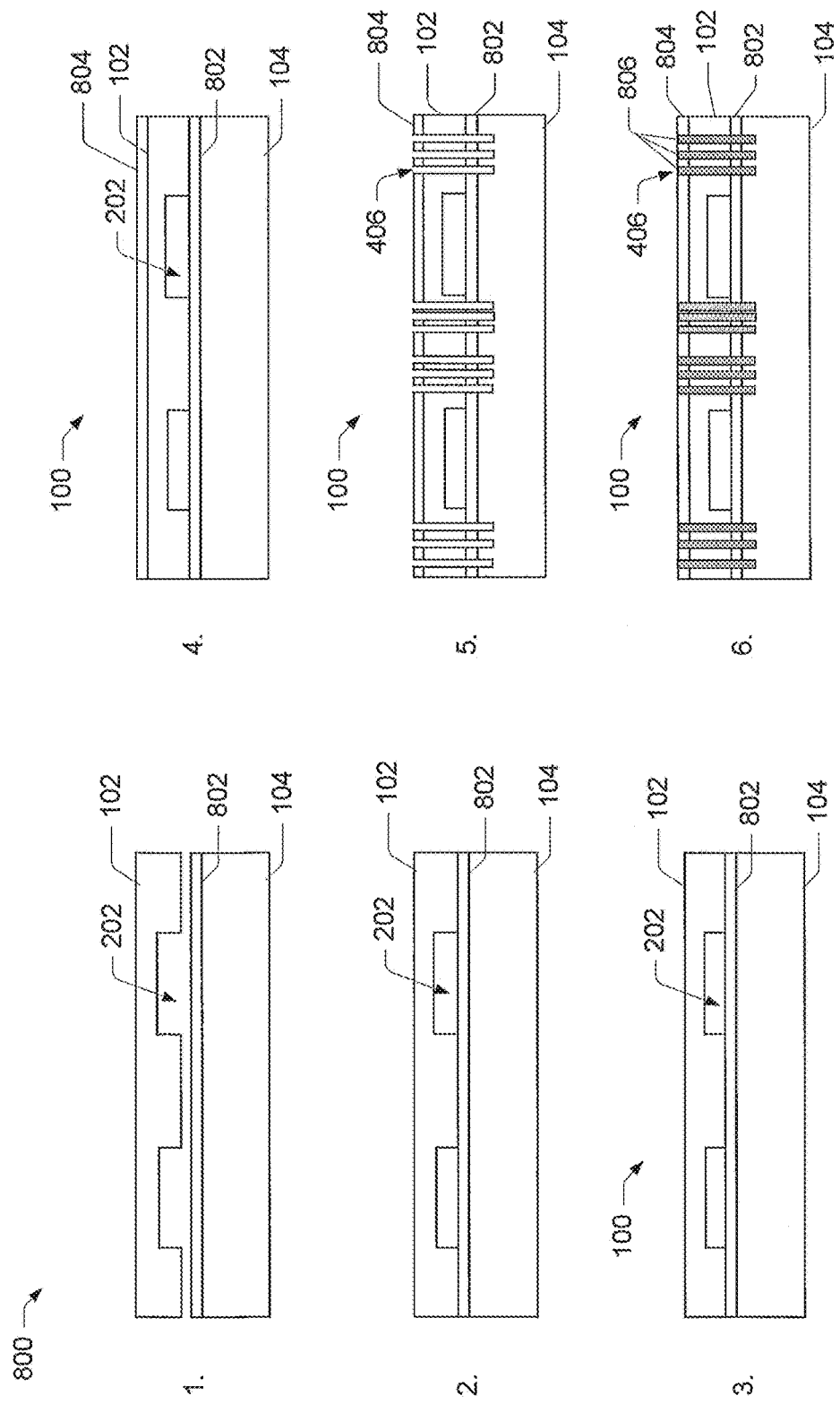
FIG. 8 is a graphical flow diagram illustrating an example processing sequence to form a sealed microelectronic device, according to another embodiment.

FIG. 8 is a graphical flow diagram illustrating an example processing sequence 800 to form a sealed microelectronic device 100, according to another embodiment using interior seals (e.g., 806). In various embodiments, the process 800 described with reference to FIG. 8 may be used to modify other assembly processes (e.g., the process 200 referred to at FIG. 2, for example) that include bonding microelectronic components (e.g., 102, 104, 206, etc.), to include techniques and devices for hermetically sealing the bonded microelectronic components (e.g., 102, 104, 206, etc.) at the bond joints, as desired.

At block 1, a recessed cavity wafer 102 is formed and prepared for bonding to a second wafer 104. In various embodiments, the bonding surface of the second wafer 104 may include an added layer 802, such as an insulating layer, a dielectric layer, a semiconductor layer, a metallic layer, and so forth.

At block 2, the cavity wafer 102 is bonded to the second wafer 104, closing the cavity 202 within. The cavity wafer 102 can be bonded to the second wafer 104 (and the layer 802) using an intimate surface bonding technique, for example, such as a ZIBOND® technique, wherein insulating surfaces (e.g., SiOx—SiOx, etc.) are bonded. In another example, the cavity wafer 102 can be bonded to the second wafer 104 using another dielectric bonding technique (e.g. die attach film or paste, a polymeric material such as a silicone or epoxy, or the like, which may not provide a hermetic seal and may not improve or fix a hermetic seal).

At block 3, the cavity wafer 102 and/or the second wafer 104 may be thinned based on the intended application. At block 4, a coating or layer 804, such as a dielectric layer or the like, may be applied to the exposed surface of the cavity wafer 102. At block 5, one or more channels 406 (or "cavity rings," partly or fully surrounding the cavities 202) can be formed through portions of the cavity wafer 102, portions of the second wafer 104, and through one or both of the layers 802 and 804. The channels 406 may be formed by etching, drilling, or otherwise removing material from the wafers 102 and 104, and may be open to an outside surface of the cavity wafer 102 or the second wafer 104.

At block 6, the cavity ring channels 406 can be partially or fully filled/plated with a metallic material (e.g., copper) to form filled seal rings 806. The filled seal rings 806 hermetically seal the bond joints between the cavity wafer 102 and the second wafer 104, sealing the cavities 202. In an implementation, the top exposed portion of the metallic seal rings 806 comprise a redistribution layer (RDL).

Referring to FIGS. 9A-9C, several embodiments of the sealed microelectronic device 100 are illustrated as examples. FIG. 9A shows a sealed microelectronic device 100 wherein the bottom portion of the one or more filled seal rings 806 is disposed within the layer 802 (which may be a dielectric layer, for example), and may or may not penetrate the second wafer 104. An opposite end of the filled seal rings 806 (e.g., at the top of the cavity wafer 102) may be exposed and contact a metal layer for electrical (and/or heat dissipation) function of the microelectronic device 100, for example.

FIG. 9B shows another sealed microelectronic device 100 wherein the bottom portion of the filled seal rings 806 is disposed within the layer 802 (which may be a dielectric layer, for example), and may or may not penetrate the second wafer 104. The top portion of the filled seal rings 806 forms a redistribution layer (RDL) over a portion of the exposed surface of the cavity wafer 102. In the embodiment, the dielectric layer 804 is patterned so that the dielectric layer 804 is not covering over the one or more cavities 202. FIG. 9C shows a further sealed microelectronic device 100 wherein the bottom portion of the filled seal rings 806 is disposed within the layer 802 (which may be a dielectric layer, for example), and may or may not penetrate the second wafer 104. The top portion of the filled seal rings 806 forms a redistribution layer (RDL) over one or more portions of the exposed surface of the cavity wafer 102. In the embodiment, the dielectric layer 804 is patterned so that the dielectric layer 804 is not covering over the one or more cavities 202, however, a different layer 902 is arranged to cover over the cavities 202. In various embodiments, the different layer 902 may comprise a substrate, a glass panel, a metallic layer, or the like.

Figure 10:
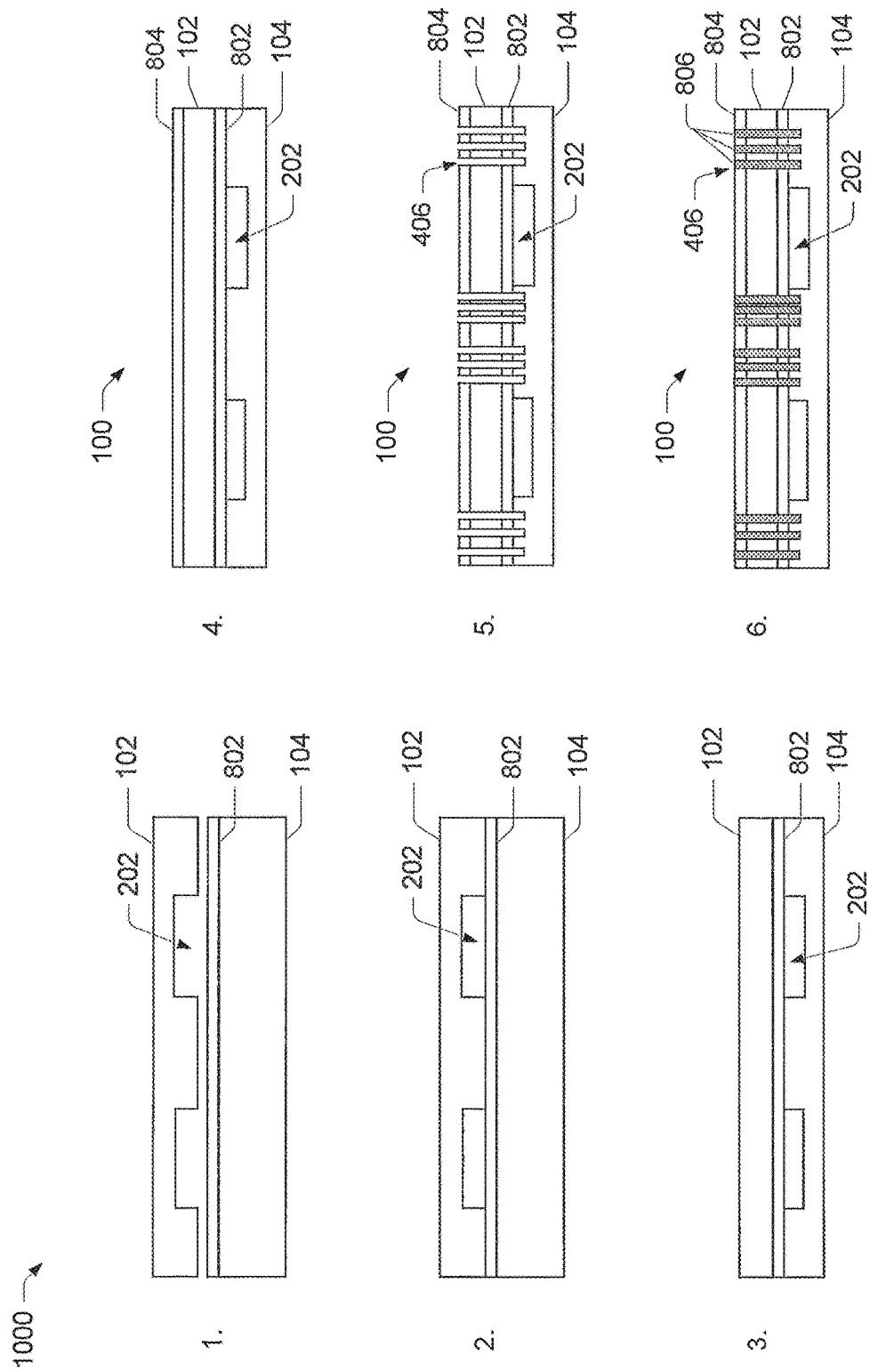
FIG. 10 is a graphical flow diagram illustrating an example processing sequence to form a sealed microelectronic device, according to a further embodiment.

FIG. 10 is a graphical flow diagram illustrating an example processing sequence 1000 to form a sealed microelectronic device 100, according to another embodiment using interior seals (e.g., 806). In various embodiments, the process 1000 described with reference to FIG. 10 may be used to modify other assembly processes (e.g., the process 200 referred to at FIG. 2, for example) that include bonding microelectronic components (e.g., 102, 104, 206, etc.), to include techniques and devices for hermetically sealing the bonded microelectronic components (e.g., 102, 104, 206, etc.) at the bond joints, as desired.

At block 1, a recessed cavity wafer 102 is formed and prepared for bonding to a second wafer 104. In various embodiments, the bonding surface of the second wafer 104 may include an added layer 802, such as an insulating layer, a dielectric layer, a semiconductor layer, a metallic layer, and so forth.

At block 2, the cavity wafer 102 is bonded to the second wafer 104, closing the cavity 202 within. The cavity wafer 102 can be bonded to the second wafer 104 (and the layer 802) using an intimate surface bonding technique, for example, such as a ZIBOND® technique, wherein insulating surfaces (e.g., SiOx—SiOx, etc.) are bonded. In another example, the cavity wafer 102 can be bonded to the second wafer 104 using another dielectric bonding technique (e.g. die attach film or paste, a polymeric material such as a silicone or epoxy, or the like, which may not provide a hermetic seal and may not improve or fix a hermetic seal).

At block 3, the cavity wafer 102 and/or the second wafer 104 may be thinned based on the intended application. Further, the assembly featuring the cavity wafer 102 and the second wafer 104 may be flipped for processing from the second wafer 104 side. At block 4, a coating or layer 804, such as a dielectric layer or the like, may be applied to the exposed surface of the second wafer 104. At block 5, one or more channels 406 (or "cavity rings," partly or fully surrounding the cavities 202) can be formed through portions of the second wafer 104, portions of the cavity wafer 102, and through one or both of the layers 802 and 804. The channels 406 may be formed by etching, drilling, or otherwise removing material from the wafers 102 and 104, and may be open to an outside surface of the second wafer 104 or the cavity wafer 102. As discussed above, the channels may extend only the interface between wafers (or dies) 102 and 104 and may extend to one or more metallic features such as a pad or via on or within wafer 104.

At block 6, the cavity ring channels 406 can be partially or fully filled/plated with a metallic material (e.g., copper) to form filled seal rings 806. The filled seal rings 806 hermetically seal the bond joints between the second wafer 104 and the cavity wafer 102, sealing the cavities 202. In an implementation, the top exposed portion of the metallic seal rings 806 may comprise a redistribution layer (RDL).

Figure 11B:
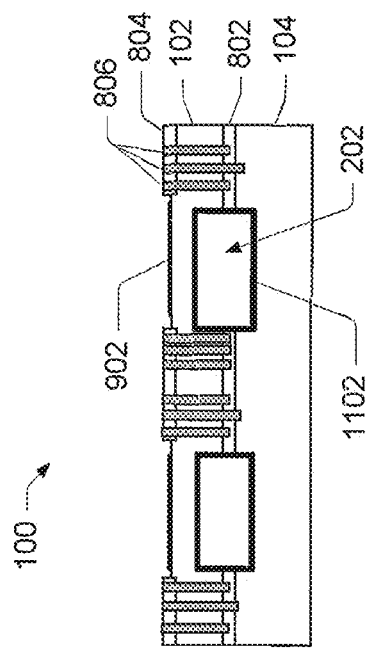
FIGS. 11A and 11B illustrate example embodiments of sealed microelectronic devices, according to various embodiments.
Figure 11A:
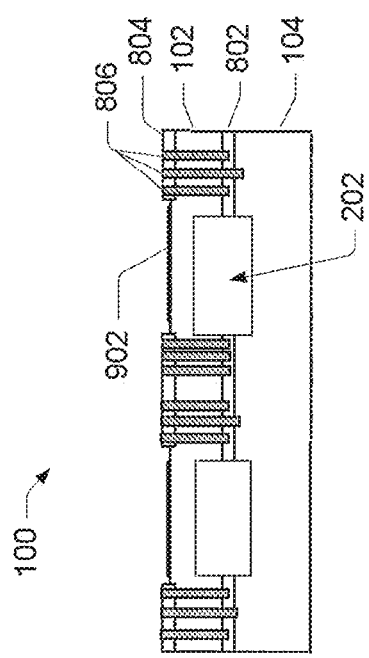

Referring to FIGS. 11A-11B, embodiments of the sealed microelectronic device 100 are illustrated as examples. FIGS. 11A and 11B show sealed microelectronic devices 100 wherein the bottom portion of the filled seal rings 806 is disposed within the layer 802 (which may be a dielectric layer, for example), and may or may not penetrate the cavity wafer 102. An opposite end of the filled seal rings 806 (e.g., at the top of the second wafer 104) may be exposed and contact a metal layer for electrical function of the microelectronic device 100, for example. In the embodiments, the dielectric layer 804 is patterned so that the dielectric layer 804 is not covering over the one or more cavities 202, however, a different layer 902 is arranged to cover over the cavities 202. In various embodiments, the different layer 902 may comprise a substrate, a glass panel, a metallic layer, or the like.

In various embodiments, as shown at FIGS. 11A and 11B, the one or more cavities 202 extend into the second wafer 104 as well as the cavity wafer 102. The filled seal rings 806 hermetically seal the bond joints between the second wafer 104 and the cavity wafer 102, sealing the cavities 202. Additionally, as shown in FIG. 11B, a metallic barrier layer 1102 may be applied within one or more of the cavities 202 to further seal the one or more cavities 202. The metallic barrier 1102 can be disposed on the side walls, or on the side, top, and bottom walls, partially or fully covering the inside surfaces of the cavities 202, as shown in FIG. 11B. In an implementation, the metallic barrier 1102 may be applied to the inside surfaces of the cavities 202 prior to bonding the cavity wafer 102 to the second wafer 104. The bonding process may include a metal-to-metal bonding (such as DBI, for instance), with or without a heated annealing, to bond the metallic barrier 1102 disposed on the inside surfaces of the cavity wafer 102 to the metallic barrier 1102 disposed on the inside surfaces of the second wafer 104, forming a continuous metallic sealing barrier 1102.

Figure 12:
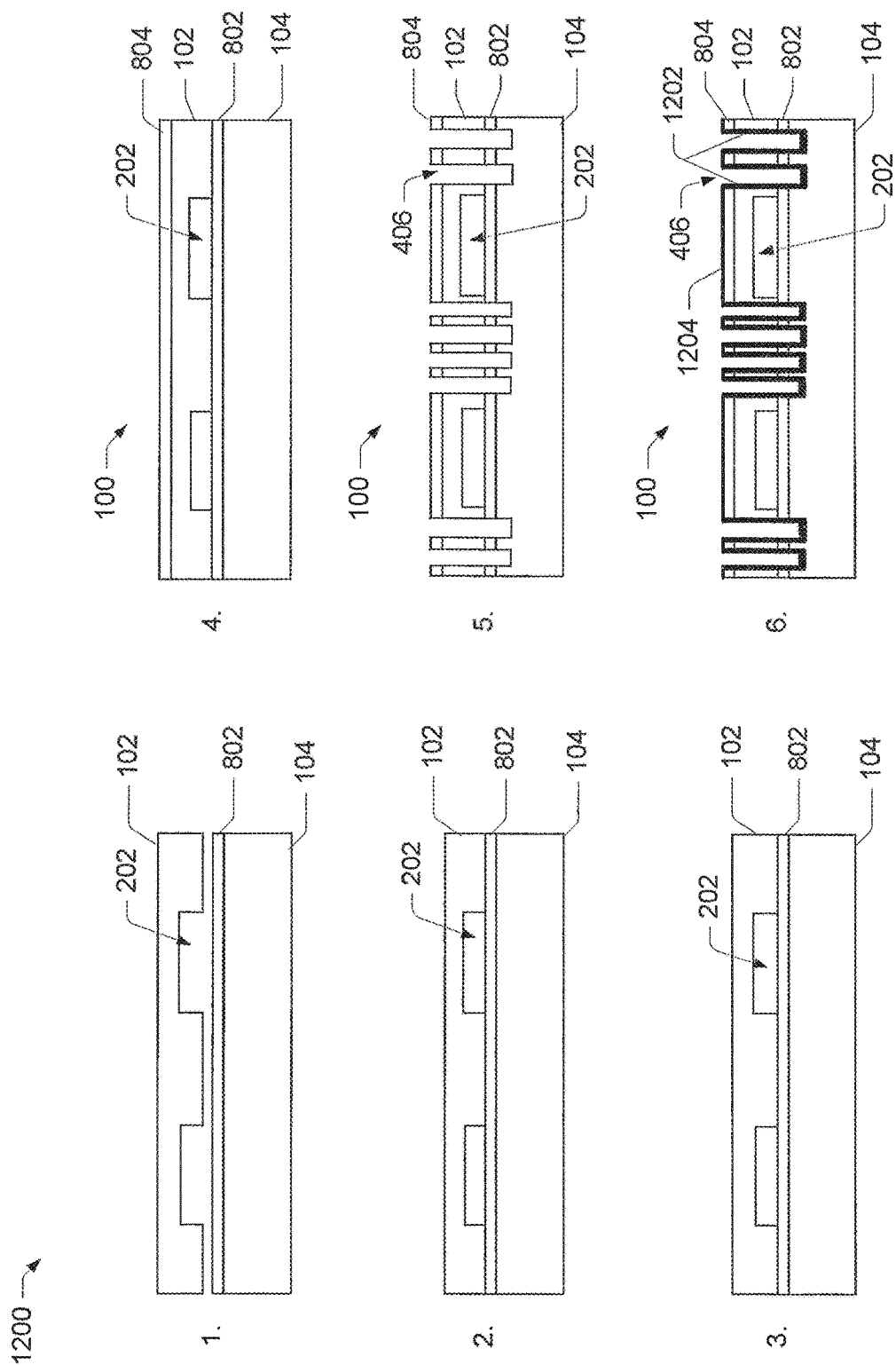
FIG. 12 is a graphical flow diagram illustrating an example processing sequence to form a sealed microelectronic device, according to an additional embodiment.

FIG. 12 is a graphical flow diagram illustrating an example processing sequence 1200 to form a sealed microelectronic device 100, according to another embodiment using interior seals (e.g., 1202). In various embodiments, the process 1200 described with reference to FIG. 12 may be used to modify other assembly processes (e.g., the process 200 referred to at FIG. 2, for example) that include bonding microelectronic components (e.g., 102, 104, 206, etc.), to include techniques and devices for hermetically sealing the bonded microelectronic components (e.g., 102, 104, 206, etc.) at the bond joints, as desired.

At block 1, a recessed cavity wafer 102 is formed and prepared for bonding to a second wafer 104 (which may or may not be a MEMS wafer, for example). In various embodiments, the bonding surface of the second wafer 104 may include an added layer 802, such as an insulating layer, a dielectric layer, a semiconductor layer, a metallic layer, and so forth.

At block 2, the cavity wafer 102 is bonded to the second wafer 104, closing the cavity 202 within. The cavity wafer 102 can be bonded to the second wafer 104 (and the layer 802) using an intimate surface bonding technique, for example, such as a ZIBOND® technique, wherein insulating surfaces (e.g., SiOx—SiOx, etc.) are bonded. In another example, the cavity wafer 102 can be bonded to the second wafer 104 using another dielectric bonding technique (e.g. die attach film or paste, a polymeric material such as a silicone or epoxy, or the like, which may not provide a hermetic seal and may not improve or fix a hermetic seal).

At block 3, the cavity wafer 102 and/or the second wafer 104 may be thinned based on the intended application. At block 4, a coating or layer 804, such as a dielectric layer or the like, may be applied to the exposed surface of the cavity wafer 102. At block 5, one or more channels 406 (or "cavity rings," partly or fully surrounding the cavities 202) can be formed through portions of the cavity wafer 102, portions of the second wafer 104, and through one or both of the layers 802 and 804. The channels 406 may be formed by etching, drilling, or otherwise removing material from the wafers 102 and 104, and may be open to an outside surface of the cavity wafer 102 or the second wafer 104.

At block 6, the cavity ring channels 406 can be partially filled/plated with a metallic material (e.g., copper) to form conformal seal rings 1202. The seal rings 1202 hermetically seal the bond joints between the cavity wafer 102 and the second wafer 104, sealing the cavities 202. In various embodiments, the channels 406 can be filled/plated to form the conformal seal rings 1202 while a metallic layer 1204 is deposited onto at least a portion of the exposed surface of the cavity wafer 102. Accordingly, in various embodiments, the channels 406 are filled in the same or in separate processes as the deposition of the metallic layer 1204.

Referring to FIGS. 13A-13C, several embodiments of the sealed microelectronic device 100 are illustrated as examples. FIGS. 13A-13C show sealed microelectronic devices 100 wherein the seal rings 1202 are formed through the cavity layer 102, and the bottom portion of the seal rings 1202 is disposed through the layer 802 (which may be a dielectric layer, for example) and also penetrate the second wafer 104. FIGS. 13A and 13B show partially filled seal rings 1202 (e.g., plated in a vacuum, for example), with the embodiment shown at FIG. 13B having a greater quantity of metal within the partially filled seal rings 1202 than the embodiment shown at FIG. 13A. Annealing the substrates (bonded wafers 102 and 104) in the partially filled condition at temperatures between 80 and 250 C can enlarge the grain size of the plated metal (e.g., 1202 and/or 1204). The process of producing the enlarged grain sizes can reduce impurities within the metal layer of the seal rings 1202 and/or the metallic layer 1204. In an implementation, the grains have a general (e.g., average) diameter that is greater than 10 percent of the width dimension of the channel 406.

FIG. 13C shows fully filled seal rings 1202 within the channels 406. In some embodiments, the annealed metal of the partially filled seal rings 1202, as shown in FIGS. 13A and 13B, can be added to or coated with an additional metal layer to form the fully filled seal rings 1202. In an embodiment, the sealed microelectronic device 100 may be annealed again after deposition of the additional metal layer. In some cases, CMP may be used prior to the final annealing or afterwards, to form a desired surface for the filled seal rings 1202. One or more additional materials may be provided in the unfilled portion of the seal ring 1202, as needed, for reliability, robustness, performance, etc.

The top (e.g., exposed) end of the filled seal rings 1202 (e.g., at the top surface of the cavity wafer 102) may be exposed and contact a metal layer for electrical function of the microelectronic device 100, for example, when bonded to another device.

The quantity of seal rings 302, 402, 404, 806, and 1202 shown in the illustrations of FIGS. 1-13 are for example and discussion. In various embodiments, a sealed microelectronic device 100 or like assembly may include fewer, or a greater quantity of seal rings 302, 402, 404, 806, and 1202, and remain within the scope of the disclosure. Moreover, various implementations described herein may be combined to further enhance the improvement over conventional techniques of fabricating a MEMS device. For example, while seal rings are shown to extend into one surface from one side of the component, seal rings may be formed from both sides and may contact each other to form a metallic structure fully extending through the sealed microelectronic device 100.

CONCLUSION

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

Each claim of this document constitutes a separate embodiment, and embodiments that combine different claims and/or different embodiments are within the scope of the disclosure and will be apparent to those of ordinary skill in the art upon reviewing this disclosure.

What is claimed is:

1. A bonded structure, comprising:
   a first microelectronic component comprising a first surface and a second surface opposite the first surface, wherein the first surface comprises a first dielectric and a first conductive feature;
   a second microelectronic component comprising a third surface comprising a second dielectric and a second conductive feature, wherein the first surface is in contact with the third surface to form a bond joint, and wherein the bond joint comprises a dielectric-to-dielectric direct bond between the first dielectric and the second dielectric and a metal-to-metal direct bond between the first conductive feature and the second conductive feature; and
   a channel extending continuously around an interior region of the bonded structure, wherein a height of the channel extends at least across the bond joint, the channel having sidewalls at least partially covered with metal, the sidewalls extending from the second surface into the first microelectronic component.

2. The bonded structure of claim 1, wherein the metal conformally coats at least portions of the sidewalls.

3. The bonded structure of claim 2, wherein the channel comprises a floor between the sidewalls, the floor conformally coated by the metal.

4. The bonded structure of claim 1, wherein the bonded structure comprises a sensor.

5. The bonded structure of claim 1, wherein the channel extends through the first microelectronic component and across the bond joint.

6. The bonded structure of claim 5, wherein the channel extends partially into the second microelectronic component.

7. The bonded structure of claim 1, wherein the second microelectronic component comprises a cavity.

8. A bonded structure, comprising:
   a first microelectronic component having a first surface comprising a first dielectric and a first conductive feature and a second surface opposite the first surface;
   a second microelectronic component having a third surface comprising a second dielectric and a second conductive feature;
   a bond joint between the first surface and the third surface, wherein the first dielectric is directly bonded to the second dielectric, and wherein the first conductive feature is directly bonded to the second conductive feature; and
   a channel extending at least partially around an interior region of the bonded structure, the channel extending from the second surface through the first microelectronic component and across the bond joint into at least a portion of the second microelectronic component, a metallic material disposed in the channel.

9. The bonded structure of claim 8, wherein the metallic material is disposed conformally along a sidewall of the channel.

10. The bonded structure of claim 8, wherein the metallic material partially fills the channel.

11. The bonded structure of claim 8, wherein the channel extends continuously around the interior region of the bonded structure.

12. The bonded structure of claim 8, wherein the channel extends partially into the second microelectronic component.

13. The bonded structure of claim 8, wherein the bond joint comprises directly bonded insulating materials.

14. The bonded structure of claim 13, wherein the bond joint further comprises directly bonded metal interconnects at the bond joint.

15. The bonded structure of claim 8, wherein the channel is annularly continuous around a periphery of the bond joint.

16. A bonded structure, comprising:
   a first microelectronic component comprising a first surface, a second surface opposite the first surface, and a side edge extending from the first surface to the second surface;
   a second microelectronic component comprising a third surface directly bonded to the first surface without an intervening adhesive to form a bond joint; and
   a channel extending continuously around an interior region of the bonded structure, the channel having sidewalls extending from the second surface into the first microelectronic component,
   wherein, the bond joint comprises directly bonded insulating materials and directly bonded metal interconnects, and
   wherein, between the side edge and the interior region as viewed in a side cross-section of the bonded structure, metal is present at every elevation between the bond joint and the second surface.

17. The bonded structure of claim 16, wherein the metal conformally coats at least portions of the sidewalls of the channel.

18. The bonded structure of claim 16, wherein the channel extends through the first microelectronic component and across the bond joint into at least a portion of the second microelectronic component.

19. A microelectronic assembly, comprising:
- a first microelectronic component having a first surface comprising a first dielectric and a first conductive feature;
- a second microelectronic component having a second surface comprising a second dielectric and a second conductive feature;
- a bond joint between the first surface and the second surface, wherein the first dielectric is directly bonded to the second dielectric, and wherein the first conductive feature is directly bonded to the second conductive feature; and
- a channel comprising an annular shape, wherein the channel extends around a periphery of the first microelectronic component, and wherein the channel extends at least to the bond joint.

20. The microelectronic assembly of claim 19, wherein the channel comprises a metallic material that seals the bond joint between the first microelectronic component and the second microelectronic component.

21. The microelectronic assembly of claim 19, wherein a metallic material is disposed in the channel.

22. The microelectronic assembly of claim 21, wherein the channel comprises a hermetic seal to prevent fluid leakage at the bond joint greater than $1 \times 10^{-6}$ atm-cm$^3$ per second.

23. The microelectronic assembly of claim 19, wherein the channel comprises a layer of a metallic material disposed over a sidewall surface of the channel.

24. The microelectronic assembly of claim 19, further comprising a third microelectronic component coupled to the second microelectronic component such that the second microelectronic component is positioned between the first microelectronic component and the third microelectronic component.

* * * * *